(12) United States Patent
Kinoshita et al.

(10) Patent No.: US 8,362,691 B2
(45) Date of Patent: Jan. 29, 2013

(54) ORGANIC ELECTROLUMINESCENT DEVICE

(75) Inventors: Masaru Kinoshita, Kanagawa (JP); Manabu Tobise, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 233 days.

(21) Appl. No.: 12/178,062

(22) Filed: Jul. 23, 2008

(65) Prior Publication Data

US 2009/0026937 A1    Jan. 29, 2009

(30) Foreign Application Priority Data

Jul. 27, 2007  (JP) .................................. 2007-196526

(51) Int. Cl.
*H01J 1/63* (2006.01)

(52) U.S. Cl. ......... 313/504; 313/503; 313/506; 428/690

(58) Field of Classification Search .......... 313/495–512; 315/169.3, 169.4; 257/40, 79, 72, 181.1, 257/194; 428/690, 917; 345/30, 36, 44, 345/45

See application file for complete search history.

(56) References Cited

U.S. PATENT DOCUMENTS

| | | | |
|---|---|---|---|
| 2002/0086180 A1* | 7/2002 | Seo et al. .............. | 428/690 |
| 2002/0101154 A1* | 8/2002 | Seo et al. .............. | 313/506 |
| 2005/0202276 A1* | 9/2005 | Mishima et al. ....... | 428/690 |
| 2005/0260440 A1* | 11/2005 | Seo et al. .............. | 428/690 |
| 2006/0063030 A1* | 3/2006 | Deaton et al. .......... | 428/690 |
| 2006/0214568 A1* | 9/2006 | Yamazaki et al. ...... | 313/504 |
| 2007/0190675 A1* | 8/2007 | Yamazaki et al. ...... | 438/22 |
| 2007/0205423 A1* | 9/2007 | Yamazaki et al. ...... | 257/89 |

FOREIGN PATENT DOCUMENTS

| | | |
|---|---|---|
| JP | 2001-155862 A | 6/2001 |
| JP | 2001-189193 A | 7/2001 |
| JP | 2001-196178 A | 7/2001 |
| JP | 2002-180040 A | 6/2002 |
| JP | 2002-313583 A | 10/2002 |
| JP | 2004-6102 A | 1/2004 |
| JP | 2005-11734 A | 1/2005 |
| JP | 2005-38672 A | 2/2005 |
| JP | 2005-294250 A | 10/2005 |
| JP | 2007-103493 A | 4/2007 |

OTHER PUBLICATIONS

Masahiro et al., "Charge carrier trapping effect by luminescent dopant molecules in single organic light emitting diodes," Applied Physics Letters, vol. 86, No. 3. publication May 1, 1998.*

(Continued)

*Primary Examiner* — Anh Mai
*Assistant Examiner* — Elmito Breval
(74) *Attorney, Agent, or Firm* — Morgan, Lewis & Bockius, LLP

(57) ABSTRACT

There is provided an organic electroluminescent device 10 having an anode 14, a cathode 18 disposed facing the anode, and an organic layer 16 that is sandwiched between the anode and the cathode and that includes at least a light emitting layer, wherein the light emitting layer includes a light emitting material having hole transportability, a host material having electron transportability and an electrically inert material, and the concentration of the light emitting material having hole transportability gradually increases from the cathode side toward the anode side. Preferably, the concentration of the electrically inert material also gradually increases from the cathode side toward the anode side.

13 Claims, 5 Drawing Sheets

OTHER PUBLICATIONS

Anna et al., "Graded mixed-layer organic light emitting devices," Applied Physics Letters, vol. 80, No. 5; publication Nov. 27, 2001.*

JP Office Action dated Jul. 17, 2012, issued in corresponding JP application No. 2007-196526.

* cited by examiner

ORGANIC ELECTROLUMINESCENT DEVICE

CROSS REFERENCE TO RELATED APPLICATION

This application claims priority under 35USC 119 from Japanese Patent Application No. 2007-196526, the disclosure of which is incorporated herein by reference.

BACKGROUND OF THE INVENTION

1. Field of the Invention

The present invention relates to an organic electroluminescent device.

2. Description of the Related Art

In recent years, light emitting apparatuses utilizing organic electroluminescent devices (organic EL devices) have been developed. FIG. 6 schematically shows the configuration of an organic EL device 1. On a substrate 2 made of glass or the like, an anode 3, organic EL layers 8 (hole transport layer 4, light emitting layer 5 and electron transport layer 6), a cathode 7 and the like are formed in layers. In the drawing, partitions, insulating films, sealing members and the like are not shown. The two electrodes 3 and 7 are connected to external lines through the lead lines (terminals) of the electrodes. When an electric field is applied to the electrodes, holes and electrons recombine in the light emitting layer 5 in the region sandwiched between the electrodes 3 and 7 to emit light.

In the case of producing a display apparatus capable of color display, for example, an anode is formed on a substrate in stripes, and then patterning is performed using organic EL materials such that organic EL layers corresponding to the colors red (R), green (G) and blue (B), respectively, are shown repeatedly on the anode. Subsequently, a cathode is formed on the organic EL layers, and the terminals (externally connecting terminals) of each of the electrodes are connected to external lines such as control lines, signal lines or the like. Thereby, organic EL devices corresponding to RGB are arranged to form pixels, and thus color display may be carried out.

A material constituting the light emitting layer is required to satisfy conditions such as good luminescence efficiency, good carrier transportability and good film forming properties. The material may be composed only of a light emitting material, or may also be composed of a mixture of a light emitting material and a host material which does not emit light and has charge transportability.

Furthermore, there have been proposed luminescent devices developed under an aim of improving the luminescence efficiency or increasing the life, by allowing the light emitting layer to have a concentration gradient of the constituent material (see, for example, Japanese Patent Application Laid-Open (JP-A) No. 2001-155862, JP-A No. 2001-189193, JP-A No. 2004-6102 and JP-A No. 2002-313583). However, in practice, an organic EL device achieving improvements in the luminescence efficiency and durability, by allowing the entire light emitting layer to emit light by precisely controlling the carrier balance in the light emitting layer, is not found.

SUMMARY OF THE INVENTION

The present invention has been made in view of the above circumstances and provides an organic electroluminescent device as follows.

According to an aspect of the present invention, provided is an organic electroluminescent device having an anode, a cathode disposed facing the anode, and an organic layer that is sandwiched between the anode and the cathode and that includes at least a light emitting layer, wherein the light emitting layer includes a light emitting material having hole transportability, a host material having electron transportability, and an electrically inert material, and the concentration of the light emitting material having hole transportability gradually increases from a cathode side toward an anode side.

DETAILED DESCRIPTION OF THE INVENTION

Hereinafter, the organic electroluminescent device according to the present invention will be described with reference to the attached drawings.

According to findings of the inventors of the invention, it was experimentally revealed that in an organic EL device utilizing a host material and a light emitting material in the light emitting layer, in the case of a typical configuration using a host material exhibiting electron transportability and a light emitting material exhibiting hole transportability, the luminescence distribution in the light emitting layer is a distribution inclined toward the hole transport layer (HTL) side. It is expected that this is because the carrier balance in the light emitting layer is in a state of excess of electrons and lack of holes, and such localized light emission causes a decrease in the luminescence efficiency, and deterioration of durability caused by centralization of luminescence load.

With regard to such light emission localized at the HTL side, it is conceived that a larger number of holes can be injected into the light emitting layer by increasing the concentration of the light emitting material exhibiting hole transportability. However, in a light emitting layer having the light emitting material exhibiting hole transportability at a higher concentration, the luminescence distribution is observed to be inclined toward both the hole transport layer (HTL) side and the electrons transport layer (ETL) side. That is, it is conceived that when the concentration of the light emitting material having hole transportability in the light emitting layer is increased, holes will be injected into the light emitting layer; however, injected holes migrate to near the interface at the ETL side without contributing to recombination, and consequently, the problem of localized light emission in the vicinity of the interface cannot be solved.

Therefore, the inventors of the invention conducted extensive research and, as a result, they found that when a light emitting material having hole transportability, a host material having electron transportability and an electrically inert material are included in the light emitting layer, and the concentration of the light emitting material having hole transportability is made higher at the anode side than at the cathode side, the luminescence distribution in the light emitting layer approaches a distribution in which light is emitted over the whole span of the layer in the thickness direction, and luminescence efficiency and durability can be thus improved.

Figure 1:
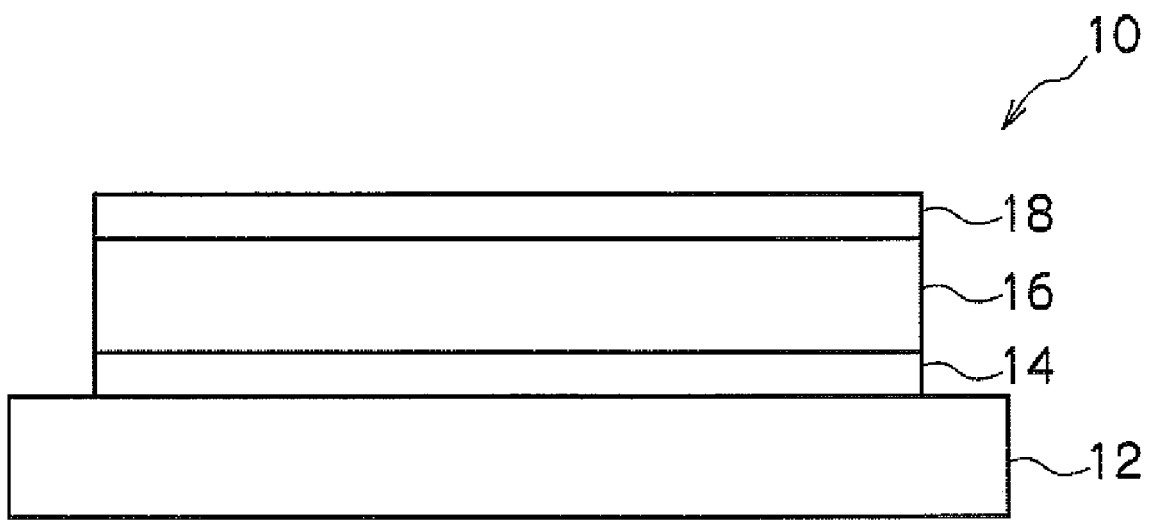
FIG. 1 is a schematic diagram showing the fundamental configuration of an organic EL device according to an embodiment of the invention.

FIG. 1 shows the configuration of an organic EL device according to an embodiment of the invention. The organic EL device 10 according to the current embodiment of the invention has a structure that an organic layer 16 including at least a light emitting layer is sandwiched between an anode 14 and a cathode 18 that are disposed facing each other on a supporting substrate 12, and a light emitting material having hole transportability, a host material having electron transportability and an electrically inert material are included in the light emitting layer, in which the concentration of the light emitting material having hole transportability gradually increases from the cathode 18 side toward the anode 14 side.

<Supporting Substrate>

The supporting substrate 12 for forming the organic EL device 10 is not particularly limited as long as it has a strength sufficient for supporting the organic EL device 10, light transmission and the like, and any known material may be used. For example, there may be mentioned inorganic materials such as zirconia-stabilized yttrium (YSZ) and glass; and organic materials such as polyesters such as polyethylene terephthalate, polybutylene phthalate and polyethylene naphthalenate, polystyrene, polycarbonates, polyether sulfones, polyallylates, polyimides, polycycloolefins, norbornene resins and poly(chlorotrifluoroethylene).

In the case of using glass for the supporting substrate 12, it is preferable to use non-alkaline glass in order to reduce the amount of ions eluted from glass. In the case of using soda-lime glass, it is preferable to use a glass provided with a barrier coat of silica or the like.

In the case of using a supporting substrate 12 formed from an organic material, it is preferable to use a material excelling in heat resistance, dimensional stability, solvent resistance, electrical insulating properties and processability. Particularly, in the case of using a plastic supporting substrate 12, it is preferable to provide a moisture permeation blocking layer or a gas barrier layer on one surface or both surfaces of the supporting substrate 12. As for the material for the moisture permeation blocking layer or gas barrier layer, an inorganic material such as silicon nitride or silicon oxide may be suitably used. The moisture permeation blocking layer or gas barrier layer may be formed by, for example, high frequency sputtering or the like.

Furthermore, in the case of using a thermoplastic supporting substrate, a hardcoat layer, an undercoat layer and the like may be further provided as necessary.

The shape, structure, size and the like of the supporting substrate 12 are not particularly limited, and may be appropriately selected in accordance with the use, purpose or the like of the organic EL display device 10. In general, the shape of the supporting substrate 12 is preferably plate-shaped from the viewpoints of handlability, easiness of formation of the organic EL device, and the like. The structure of the supporting substrate 12 may be a single layer structure, or may be a laminated structure. The supporting substrate 12 may also be composed of a single member, or may also be composed of two or more members.

In addition, the emitting apparatuses based on the organic EL device are classified into a bottom emission type in which the light emitted from the light emitting layer is extracted through the supporting substrate 12 side, and a top emission type in which the light is extracted through the opposite side of the supporting substrate 12. The invention may employ any of the two types. In the case of producing a top emission type organic EL emitting apparatus, since it is not necessary to extract the emitted light through the supporting substrate 12 side, for example, a metal substrate made of stainless steel, Fe, Al, Ni, Co, Cu or an alloy thereof, or a silicon substrate may be used. A supporting substrate made of metal has high strength even with a small thickness, and has high gas barrier properties against the moisture or oxygen in the atmosphere. In the case of using a supporting substrate made of metal, it is required to provide an insulating film to secure electrical insulating properties between the supporting substrate 12 and a lower electrode 14.

<Organic EL Device>

The organic EL device 10 according to the invention may employ, for example, a layer configuration as shown in the following, but the layer configuration is not limited to these, and may be appropriately determined in accordance with the purpose or the like.

Anode/light emitting layer/cathode

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/blocking layer/electron transport layer/cathode Anode/hole injection layer/hole transport layer/light emitting layer/blocking layer/electron transport layer/electron injection layer/cathode Usually, the electrode on the supporting substrate 12 side (lower electrode) 14 is made into an anode, while the electrode on the sealing substrate (not depicted) side (upper electrode) 18 is made into a cathode. However, it is also possible to make the lower electrode as the cathode, and the upper electrode as the anode. In the following description, there will be described a configuration having the members sequentially formed starting from the anode 14 on the supporting substrate 12, but it is also possible to form the assembly in the reverse manner, starting from the cathode on the supporting substrate 12.

—Anode—

The anode 14 is not particularly limited in the shape, structure, size or the like, as long as it may function as an electrode for supplying holes to the organic EL layer 16, and the component material may be appropriately selected from known electrode materials in accordance with the use, purpose or the like of the organic EL device 10.

As for the material constituting the anode 14, for example, metals, alloys, metal oxides, electrically conductive compounds or mixtures thereof, may be suitably mentioned. Specific examples thereof include electrically conductive metal oxides such as tin oxide doped with antimony or fluorine (ATO, FTO), tin oxide, zinc oxide, indium oxide, indium-tin oxide (ITO) and indium zinc oxide (IZO); metals such as gold, silver, chromium and nickel; mixtures or laminates of these metals and electrically conductive metal oxides; inorganic conductive materials such as copper iodide and copper sulfide; organic conductive materials polyaniline, polythiophene and polypyrrole; and laminates of these materials and ITO; and the like. Among these, preferred are the electrically conductive metal oxides, and particularly preferably, ITO is preferred from the viewpoints of productivity, high conductivity, transparency and the like.

As for the method for forming the anode 14, for example, there may be mentioned wet methods such as printing methods and coating methods; physical methods such as vacuum deposition, sputtering and ion plating; and chemical methods such as CVD and plasma CVD. The method may be appropriately selected while considering the conformability of the material for constituting the anode 14, or the like. For example, in the case of using ITO as the material for anode, the anode 14 may be formed by direct current or high frequency sputtering, vacuum deposition, ion plating or the like.

The position for forming the anode 14 may be appropriately selected in accordance with the use, purpose or the like of the organic EL device 10, and the anode may be formed over the entire surface of the supporting substrate 12, or may be formed over a part of the surface.

During the formation of the anode 14, patterning may be carried out by chemical etching based on photolithography or the like, or may be carried out by physical etching utilizing laser or the like. Furthermore, vacuum deposition, sputtering or the like may be performed with superimposing a mask on the anode, or it is also acceptable to perform a lift-off method or a printing method.

The thickness of the anode 14 is preferably appropriately selected according to the material constituting the anode 14 or the like, but typically, the thickness is about 10 nm to 50 μm, and preferably 50 nm to 20 μm.

The resistance value of the anode 14 is preferably $10^3 \Omega/\square$ or less, and more preferably $10^2 \Omega/\square$ or less, in order to securely supply holes to the organic EL layer 16.

In the case of extracting light from the anode side, the light transmittance is preferably 60% or higher, and more preferably 70% or higher. Detailed descriptions on transparent anode may be found in "New Development of Transparent Electrode Films," supervised by Yutaka Sawada, CMC Publishing Co., Ltd. (1999), and the matters described therein are also applicable to the invention. For example, in the case of using a plastic supporting substrate having low heat resistance, a transparent anode produced by forming a film using ITO or IZO at a low temperature of 150° C. or lower, is preferred.

—Organic Layer—

The organic layer (organic EL layer) 16 is sandwiched between the anode 14 and the cathode 18, and has a configuration including at least a light emitting layer. As for layers constituting the organic layer 16 other than the light emitting layer, as previously described, various layers such as a hole transport layer, an electron transport layer, a charge blocking layer, a hole injection layer and an electron injection layer may be mentioned. As a preferred layer configuration, there may be mentioned an embodiment in which, from the anode side, a hole transport layer, a light emitting layer and an electron transport layer are formed in this order, and the configuration may further have, for example, a charge blocking layer or the like, between the hole transport layer and the light emitting layer, or between the light emitting layer and the electron transport layer. A hole injection layer may be provided between the anode 14 and the hole transport layer, or an electron injection layer may be provided between the cathode 18 and the electron transport layer. Furthermore, each of the layers may be divided into plural secondary layers.

Each layer constituting the organic layer 16 may be suitably formed by any of dry film forming methods such as deposition and sputtering, transfer methods, printing methods, and the like.

—Light Emitting Layer—

The light emitting layer is a layer having a function of, when an electric field is applied, receiving holes from the anode 14, the hole injection layer or the hole transport layer, receiving electrons from the cathode 18, the electron injection layer or the electron transport layer, and providing a site for recombination of the holes and the electrons to emit light.

The organic EL device 10 according to the present invention contains, irrespective of which layer configuration being taken, a light emitting material having hole transportability, a host material having electron transportability, and an electrically inert material in the light emitting layer, and the concentration of the light emitting material having hole transportability is set to be higher at the anode side than at the cathode side. Here, the light emitting material having hole transportability is a material which has higher hole transportability than electron transportability, and emits light, while the host material having electron transportability is a material which has higher electron transportability than hole transportability, and does not emit light. The electrically inert material is a material which does not have charge transportability (electron transportability and hole transportability), and does not emit light, and is also referred to as binder.

Figure 2:
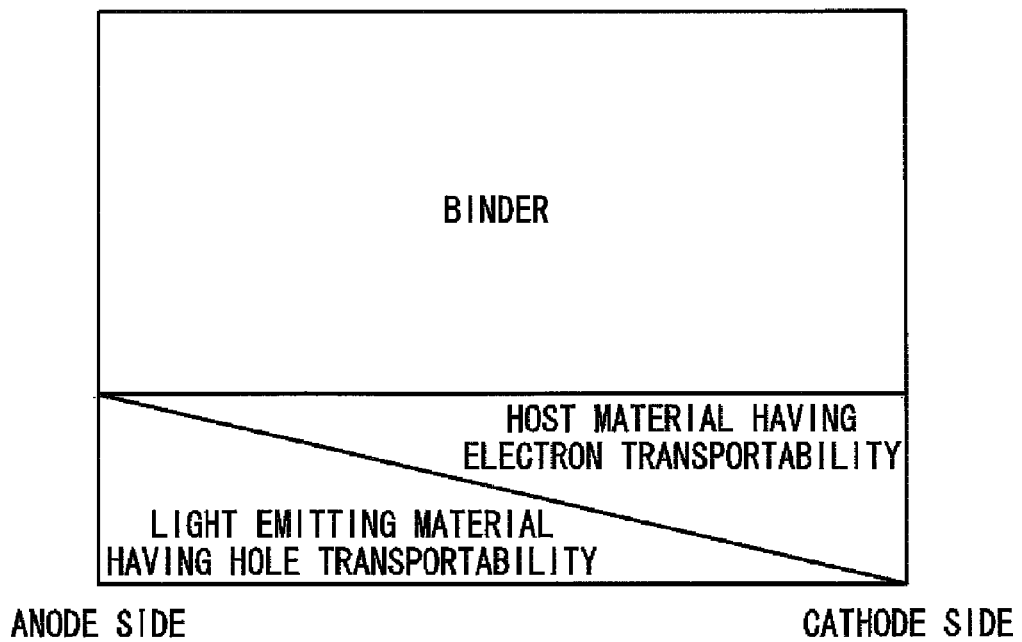
FIG. 2 is a diagram showing the concentration distribution in the light emitting layer of an organic EL device according to an embodiment of the invention.

FIG. 2 shows the concentration distribution in the light emitting layer of an organic EL device according to an example (first aspect) of the present invention. This light emitting layer comprises a light emitting material having hole transportability, a host material having electron transportability, and an electrically inert material (binder), and the concentration of the light emitting material having hole transportability gradually increases from the cathode side toward the anode side. On the other hand, the concentration of the host material having electron transportability gradually decreases from the cathode side toward the anode side, and the concentration of the binder is constant along the thickness direction.

When a light emitting layer having such concentration distribution is used, the luminescence distribution in the light emitting layer approaches a distribution in which light is emitted over the whole span of the layer in the thickness direction, and the luminescence efficiency and durability can be improved. One of the reasons why the luminescence distribution approaches a distribution in which light is emitted over the whole span of the layer in the thickness direction, is conceived to be because, since the concentration of the light emitting material having hole transportability is higher at the anode side than at the cathode side, the holes injected from the anode side into the light emitting layer are restrained from migrating as the holes advance toward the cathode side, and thus the holes undergo recombination with electrons even in the central part of the light emitting layer, resulting in light emission. Furthermore, the light emitting layer includes an electrically inert material (binder). Although this binder is a material having no charge transportability, the binder functions as a dispersant of the light emitting material, and also functions to suppress the electron transportability provided by the host material. Therefore, it is also conceived that the migration of the electrons injected from the cathode side into the light emitting layer is suppressed, and the recombination with holes may easily occur even at the cathode side and in the central part, before the electrons migrate toward the anode side of the light emitting layer. As such, the light emitting layer includes a light emitting material having hole transportability, a host material having electron transportability and an electrically inert material, and mainly, by a synergistic effect based on the fact that the concentration of the light emitting material having hole transportability in the light emitting layer gradually increases from the cathode side toward the anode side (in other words, gradually decreasing from the anode side toward the cathode side), and that a binder is included in the light emitting layer, it becomes easier for the electrons and the holes to recombine in the vicinity of the end parts of the light emitting layer, as well as in the vicinity of the central part of the light emitting layer. Thus, light emission may be achieved efficiently in the entirety of the light emitting layer. Thereby, the luminescence distribution inclined toward the anode side is greatly improved, thus luminescence efficiency being enhanced, and also centralization of the luminescence load is prevented, thus durability being enhanced.

Figure 3:
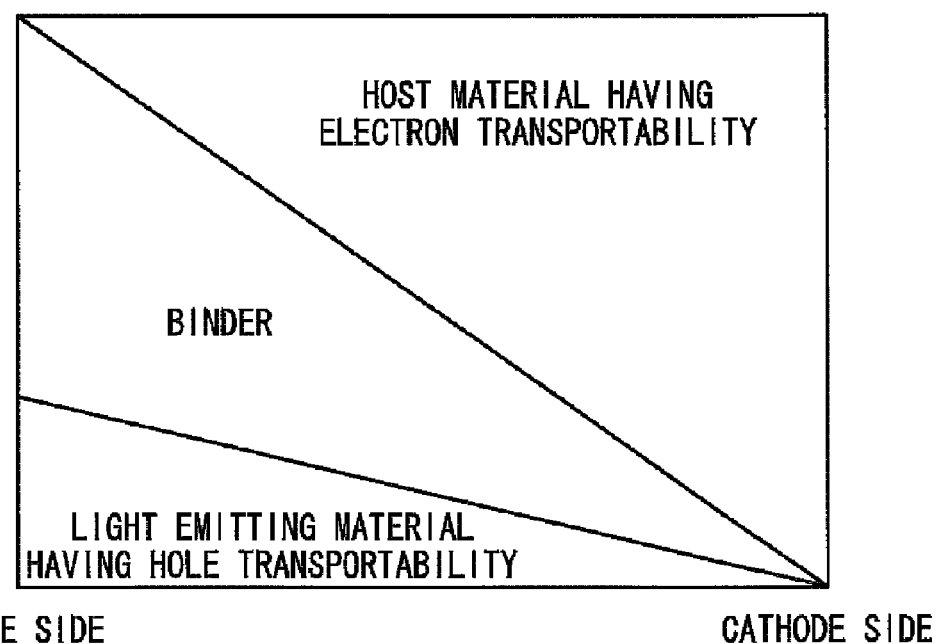
FIG. 3 is a diagram showing the concentration distribution in the light emitting layer of an organic EL device according to another embodiment of the invention.

FIG. 3 shows the concentration distribution in the light emitting layer of an organic EL device according to another example (second aspect) of the present invention. This light emitting layer also includes a light emitting material having hole transportability, a host material having electron transportability and an electrically inert material (binder), and the concentration of the light emitting material having hole transportability gradually increases from the cathode side toward the anode side, while the concentration of the binder also gradually increases from the cathode side toward the anode side. As such, when the concentration of the binder also gradually increases from the cathode side toward the anode side, the effect exerted by the binder is small at the cathode side and is large at the anode side. Thereby, the electrons injected from the cathode side into the light emitting layer transfer slower as they go closer to the anode side from the cathode side, and thus localized light emission is further suppressed, while the luminescence efficiency and durability can be further improved.

The concentration distributions of the various materials constituting the light emitting layer are not particularly limited, as long as the concentration of the light emitting material having hole transportability gradually increases from the cathode side toward the anode side. However, for example, if the concentration of the light emitting material having hole transportability is too low at the anode side of the light emitting layer, holes are not injected sufficiently into the light emitting layer, and on the contrary, if the concentration is too high, concentration quenching or associated light emission may occur, and there is a risk of having a decrease in efficiency or deterioration of chromaticity. Furthermore, if, at the cathode side in the light emitting layer, the concentration of the light emitting material having hole transportability or the concentration of the binder is high and the concentration of the host material having electron transportability is too low, electrons are not injected sufficiently into the light emitting layer, and there is a risk of having a decrease in the luminescence intensity.

From such viewpoints as described above, the concentration (% by mass) of the light emitting material having hole transportability in the region near the interface at the cathode side of the light emitting layer is preferably 0 to 10%, more preferably 0 to 7%, and particularly preferably 0 to 5%. On the other hand, the concentration (% by mass) of the light emitting material having hole transportability in the region near the interface at the anode side of the light emitting layer is preferably 5 to 100%, more preferably 10 to 80%, and particularly preferably 15 to 70%.

It is also preferable that the concentration of the light emitting material having hole transportability in the region near the interface at the cathode side of the light emitting layer is from 0% by mass to 50% by mass, and more preferably from 0% by mass to 20% by mass, relative to the concentration of the light emitting material having hole transportability in the region near the interface at the anode side of the light emitting layer.

Additionally, in the present specification, the term "region near the interface at the cathode side of the light emitting layer" is defined to mean a region extending to a thickness of 10% of the total thickness of the light emitting layer from the interface at the cathode side of the light emitting layer, while the term "region near the interface at the anode side of the light emitting layer" is defined to mean a region extending to a thickness of 10% of the total thickness of the light emitting layer from the interface at the anode side of the light emitting layer. Further, the concentration in the region is defined to mean the average concentration throughout the region. The concentrations of the various materials in the "region near the interface at the cathode side (anode side) of the light emitting layer" can be measured according to a method such as time-of-flight secondary ion mass spectrometry (TOF-SIMS), or etching/X-ray photoelectron spectroscopy (XPS/ESCA).

The light emitting material having hole transportability is preferably contained in the light emitting layer in an amount of 5 to 50% by mass, and more preferably in an amount of 10 to 30% by mass, from the viewpoints of obtaining sufficient luminescence intensity, preventing concentration quenching, and the like.

It is preferable that the concentration of the host material having electron transportability in the light emitting layer gradually increases from the anode side toward the cathode side, contrary to the concentration of the light emitting material having hole transportability, from the viewpoints as described above. The concentration (% by mass) of the host material having electron transportability in the region near the interface at the cathode side of the light emitting layer is preferably 5 to 100%, more preferably 10 to 80%, and particularly preferably 15 to 70%. On the other hand, the concentration (% by mass) of the host material having electron transportability in the region near the interface at the anode side of the light emitting layer is preferably 0 to 10%, more preferably 0 to 7%, and particularly preferably 0 to 5%.

The host material having electron transportability is preferably contained in the light emitting layer in an amount of 5 to 90% by mass, and more preferably in an amount of 10 to 70% by mass, from the viewpoint of carrier balance or the like.

Furthermore, it is also preferable that the concentration of the electrically inert material (binder) in the light emitting layer is constant or gradually increases from the cathode side toward the anode side, from the viewpoints as described above. The concentration (% by mass) of the electrically inert material (binder) in the region near the interface at the cathode side of the light emitting layer is preferably 0 to 95%, more preferably 0 to 90%, and particularly preferably 0 to 85%. On the other hand, the concentration (% by mass) of the electrically inert material (binder) in the region near the interface at the anode side of the light emitting layer is preferably 0 to 95%, more preferably 10 to 90%, and particularly preferably 20 to 85%.

The electrically inert material (binder) is preferably contained in the light emitting layer in an amount of 1 to 90% by mass, and more preferably in an amount of 10 to 80% by mass, in order to sufficiently obtain the effect derived from the binden.

The method of gradually increasing the concentration of the light emitting material having hole transportability in the light emitting layer is not particularly limited and, for example, the concentration may be gradually increased from the cathode side toward the anode side continuously with a linear or a curved gradient of increase, or may be gradually increased in a stepwise manner. Further, for example, in the case of a light emitting layer having a concentration gradient that decreases within the light emitting layer, even if there are regions within the layer where the concentration increases locally, as long as the concentration gradient decreases overall, the light emitting layer is within the intended scope of the present application. In addition, from the viewpoints of avoiding a high luminescence load due to localized light emission, and more uniformly emitting light over the entire span of the light emitting layer, it is preferable for the light emitting material having hole transportability in the light emitting layer has a concentration that gradually increases continuously with a linear gradient of increase from the cathode side toward the anode side, as shown in FIG. 2 and FIG. 3.

Also, in the case where the host material having electron transportability or the electrically inert material in the light emitting layer has a concentration distribution, it is preferable that the concentration gradually decreases or increases continuously with a linear or a curved gradient of decrease or increase along the thickness direction of the light emitting layer, or that the concentration gradually decreases or gradually increases in a stepwise manner.

Next, various materials constituting the light emitting layer will be described in more detail.

(A) Light Emitting Material Having Hole Transportability

The light emitting material in the light emitting layer according to the present invention may be a fluorescent light emitting material or a phosphorescent light emitting material, as long as it is capable of transporting holes. From the viewpoints of enhancing durability and lowering the driving voltage, the light emitting material having hole transportability preferably has an ionization potential (Ip) of 5.1 eV or more and 6.4 eV or less, more preferably 5.4 eV or more and 6.2 eV or less, and even more preferably 5.6 eV or more and 6.0 eV or less. Also, from the viewpoints of improving durability and lowering the driving voltage, the light emitting material preferably has an electron affinity (Ea) of 1.2 eV or more and 3.1 eV or less, more preferably 1.4 eV or more and 3.0 eV or less, and even more preferably 1.8 eV or more and 2.8 eV or less.

Specific examples of such light emitting material having hole transportability include the following materials.

There may be mentioned pyrrole compounds, indole compounds, carbazole compounds, imidazole compounds, polyarylalkane compounds, arylamine compounds, styryl compounds, styrylamine compounds, thiophene compounds, aromatic fused polycyclic compounds and the like, as well as metal complexes.

The metal ion in the metal complexes is not particularly limited, but from the viewpoints of improving the luminescence efficiency, improving durability and lowering the driving voltage, the metal ion is preferably a transition meta ion or a rare earth metal ion, more preferably an iridium ion, a platinum ion, a gold ion, a rhenium ion, a tungsten ion, a rhodium ion, a ruthenium ion, an osinium ion, a palladium ion, a silver ion, a copper ion, a cobalt ion, a nickel ion, a lead ion, or a rare earth metal ion (for example, a europium ion, a gadolinium ion, a terbium ion or the like), even more preferably an iridium ion, a platinum ion, a gold ion, a rhenium ion, a tungsten ion, a europium ion, a gadolinium ion, or a terbium ion, and particularly preferably an iridium ion, a platinum ion, a rhenium ion, a europium ion, a gadolinium ion or a terbium ion, with an iridium ion being most preferred. Among the metal complexes having an iridium ion, particularly preferred is a metal complex having a carbon-Ir bond or a nitrogen-Ir bond (the bond in this case may be any of coordination bond, ionic bond and covalent bond).

Specific examples of such light emitting material having hole transportability include, but not limited to, the following materials.

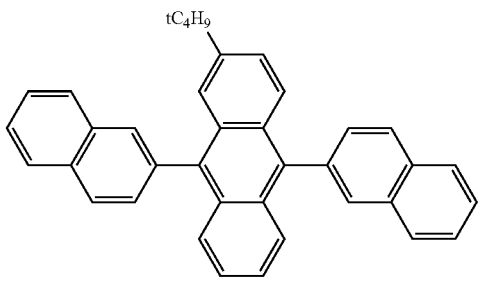

HE-1

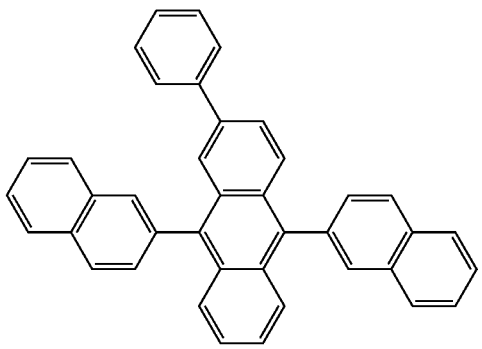

HE-2

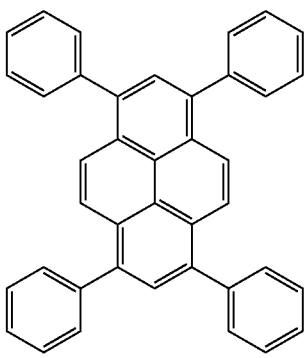

HE-3

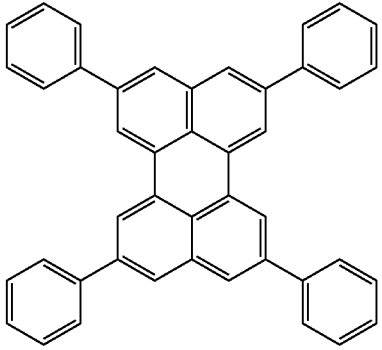

HE-4

HE-5
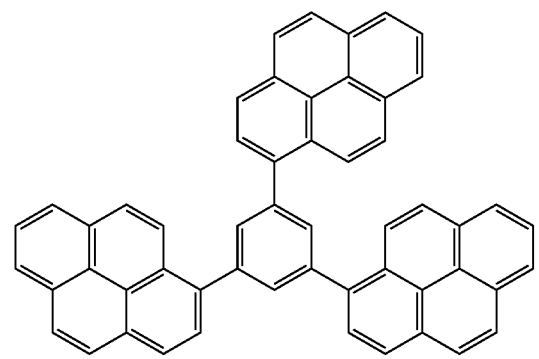
HE-6
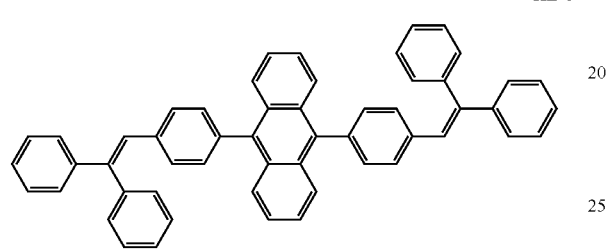
HE-7
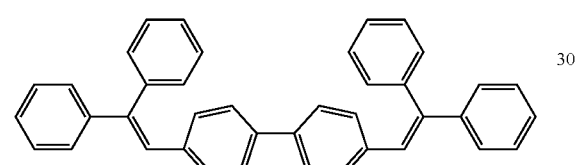
HE-8
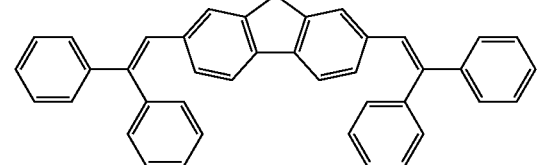
HE-9
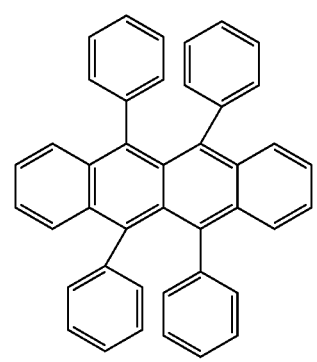
HE-10
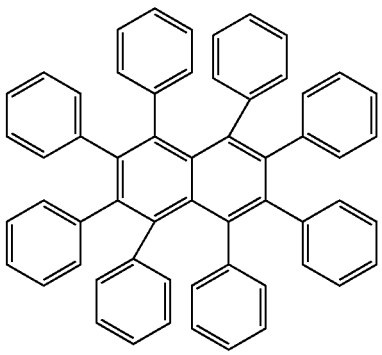
HE-11
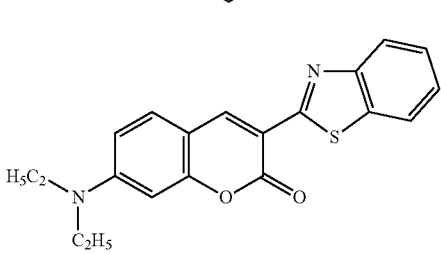
HE-12
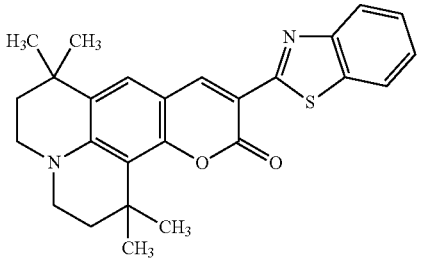
HE-13
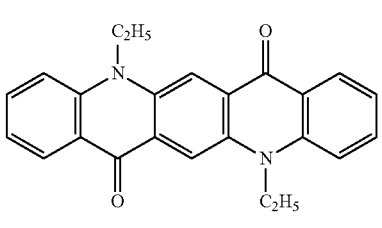
HE-14
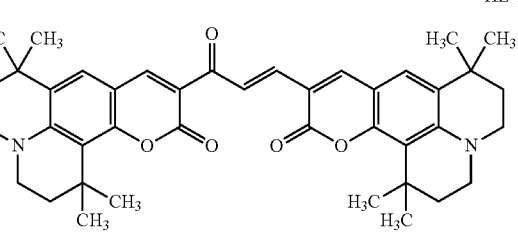
HE-15
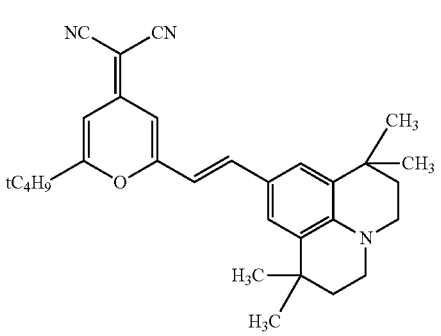

-continued
HE-16
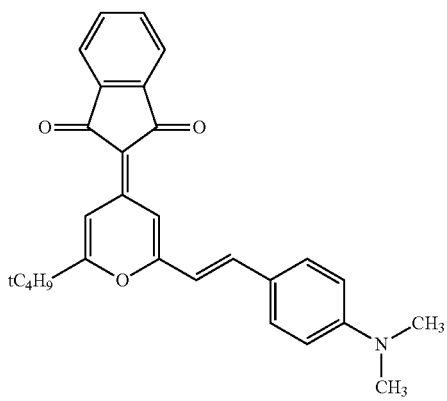
HE-21
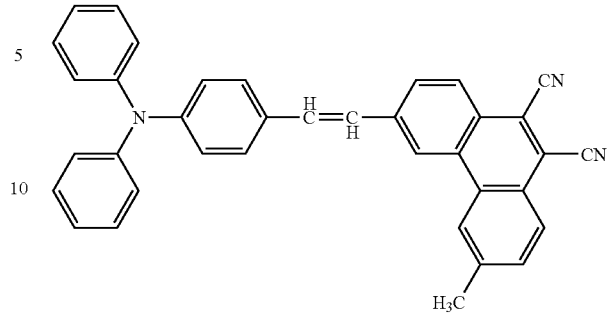
HE-17
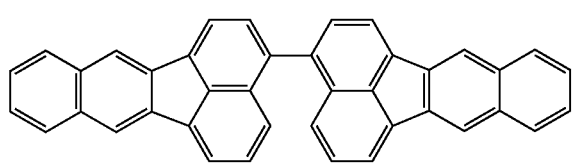
HE-22
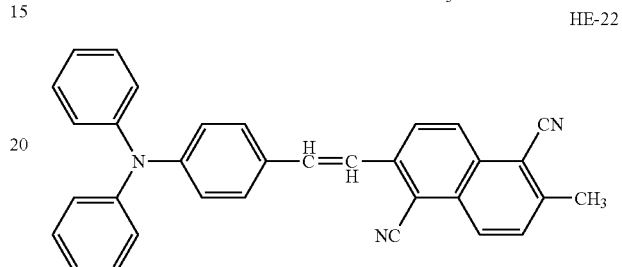
HE-18
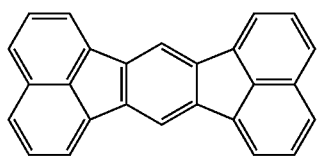
HE-23
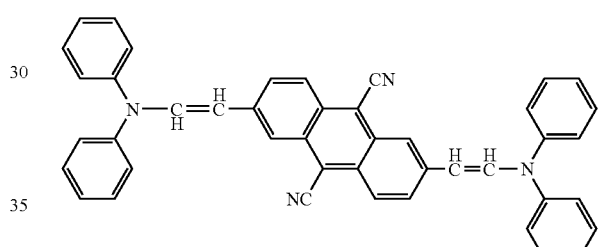
HE-19
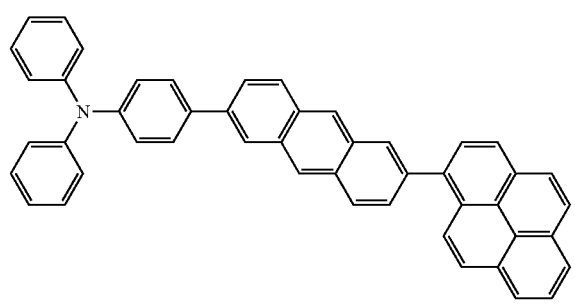
HE-24
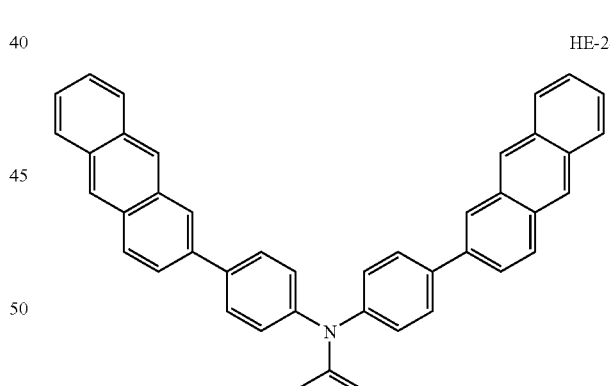
HE-20
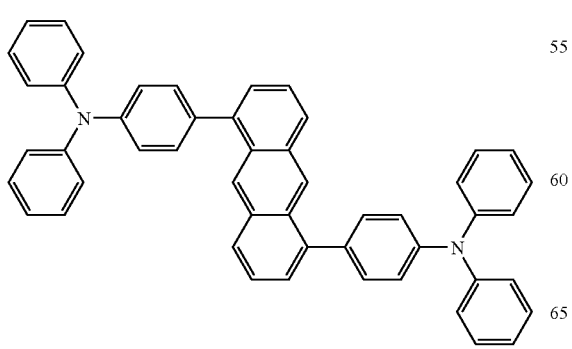
HE-25
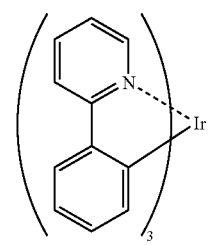

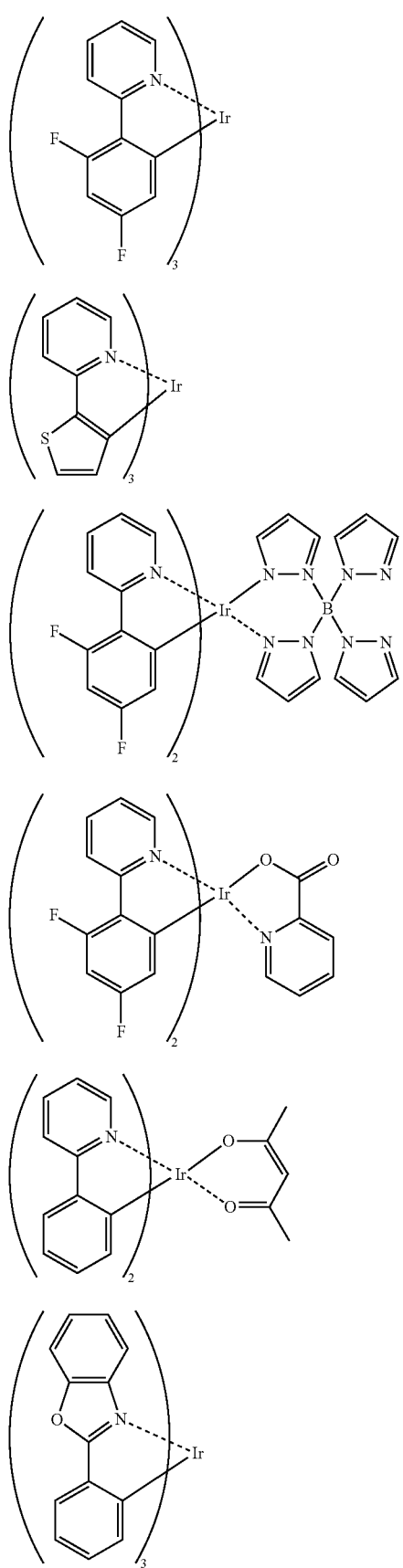
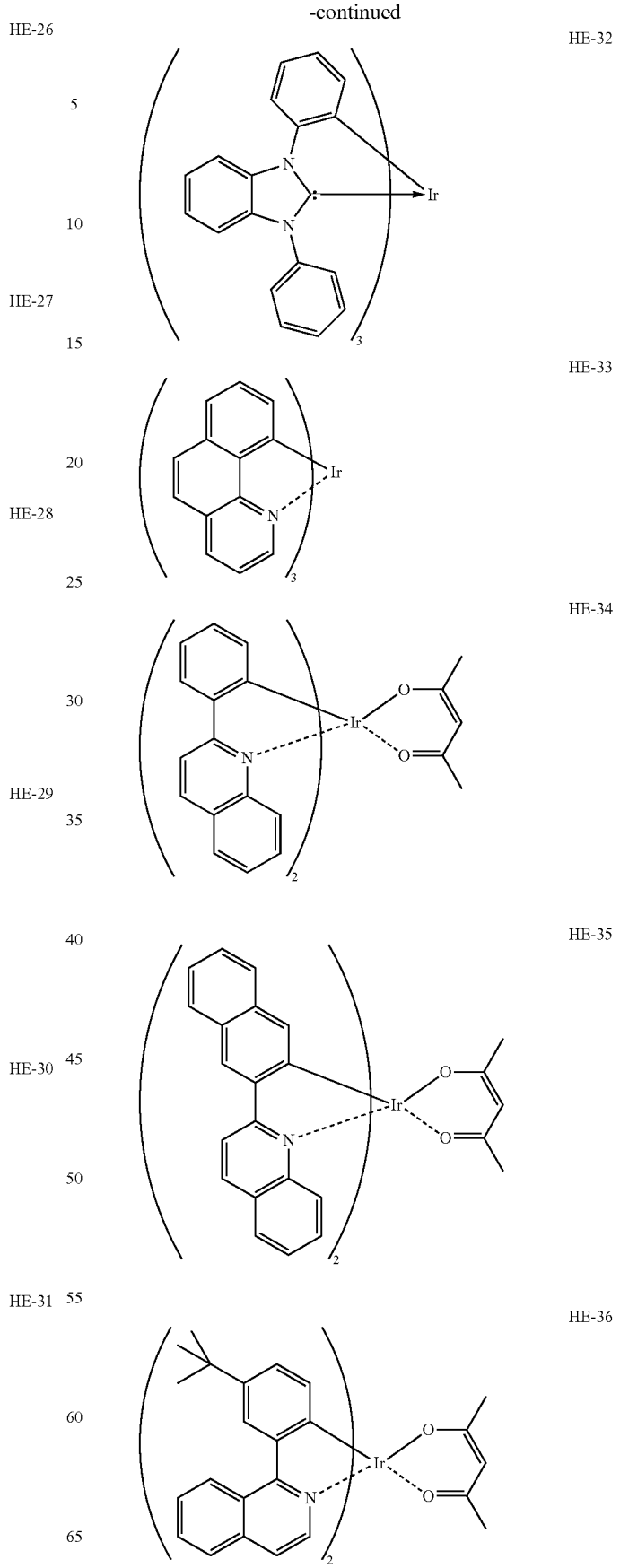

HE-37 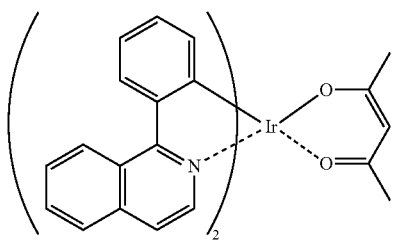

HE-38 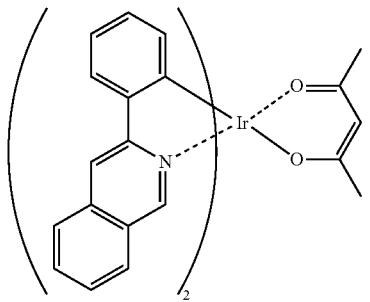

HE-39 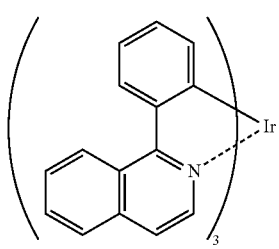

HE-40 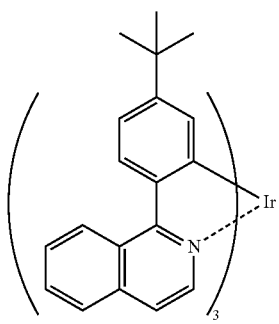

HE-41 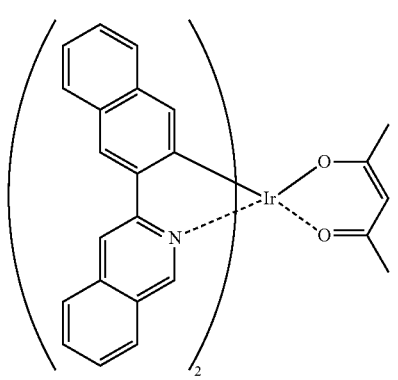

HE-42 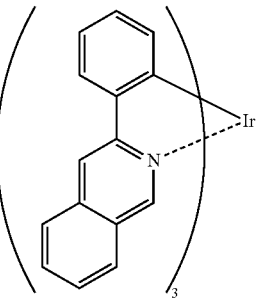

HE-43 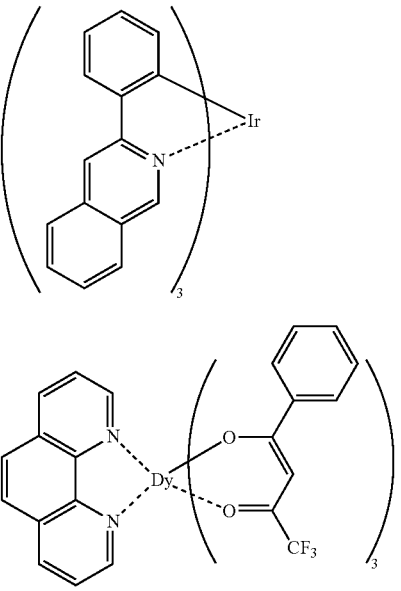

HE-44 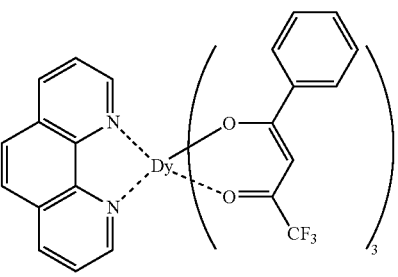

HE-45 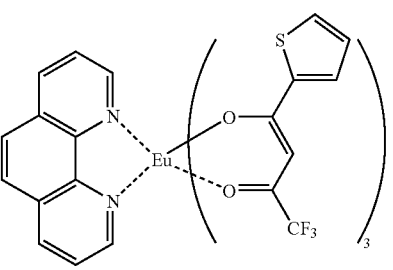

(B) Host Material Having Electron Transportability

For the host material constituting the light emitting layer of the present invention, a host material having electron transportability (electron transporting host material) is used.

The electron transporting host material in the light emitting layer used in the present invention preferably has an electron affinity, Ea of 2.5 eV or more and 3.5 eV or less, more preferably 2.6 eV or more and 3.4 eV or less, and even more preferably 2.8 eV or more and 3.3 eV or less, from the viewpoints of enhancing durability and lowering the driving voltage. Also, from the viewpoints of enhancing durability and lowering the driving voltage, the host material preferably has an ionization potential, Ip of 5.7 eV or more and 7.5 eV or less, more preferably 5.8 eV or more and 7.0 eV or less, and even more preferably 5.9 eV or more and 6.5 eV or less.

Specific examples of such host material having electron transportability include the following materials.

There may be mentioned pyridine, pyrimidine, triazine, imidazole, pyrazole, triazole, oxazole, oxadiazole, fluorenone, anthraquinodimethane, anthrone, diphenylquinone, thiopyrane dioxide, carbodiimide, fluorenylidenemethane, distyrylpyrazine, fluorine-substituted aromatic compounds, heterocyclic tetracarboxylic acid anhydride such as naphthaleneperylene, phthalocyanine and derivatives thereof (may form a fused ring with other rings), or various metal complexes represented by metal complexes of 8-quinolinol derivatives, metal phthalocyanine, and metal complexes having benzoxazole or benzothiazole as the ligand, and the like.

Preferred examples of the host material having electron transportability include metal complexes, azole derivatives (benzimidazole derivatives, imidazopyridine derivatives and the like), and azine derivatives (pyridine derivatives, pyrimidine derivatives, triazine derivatives and the like), and among them, metal complex compounds are preferred in the present invention, from the viewpoint of durability. The metal complex compound is more preferably a metal complex having a ligand having at least one nitrogen atom, oxygen atom or sulfur atom which coordinates a metal ion.

The metal ion in the metal complex is not particularly limited, but is preferably a beryllium ion, a magnesium ion, an aluminum ion, a gallium ion, a zinc ion, an indium ion, a tin ion, a platinum ion or a palladium ion, and is more preferably a beryllium ion, an aluminum ion, a gallium ion, a zinc ion, a platinum ion or a palladium ion, with an aluminum ion, a zinc ion, a platinum ion or a palladium ion being even more preferred.

As for the ligand contained in the metal complexes, there are various known ligands, but for example, the ligands described in H. Yersin, "Photochemistry and Photophysics of Coordination Compounds," Springer Verlag (1987); Yamamoto Akio, "Organometallic Chemistry—Foundation and Application," Shokabo Publishing Co., Ltd. (1982); and the like.

The ligand is preferably a nitrogen-containing heterocyclic ligand (preferably having 1 to 30 carbon atoms, more preferably 2 to 20 carbon atoms, and particularly preferably 3 to 15 carbon atoms), and may be a monodentate ligand or a bidentate or higher-dentate ligand. The ligand is preferably a bidentate, tridentate, tetradentate, pentadentate or hexadentate ligand. Furthermore, a mixed ligand of a bidentate, tridentate, tetradentate, pentadentate or hexadentate ligand and a monodentate ligand, is also preferred.

Examples of the ligand include azine ligands (for example, a pyridine ligand, a bipyridyl ligand, a terpyridine ligand and the like), hydroxyphenylazole ligands (for example, a hydroxyphenylbenzimidazole ligand, a hydroxyphenylbenzoxazole ligand, a hydroxyphenylimidazole ligand, a hydroxyphenylimidazopyridine ligand and the like), alkoxy ligands (preferably having 1 to 30 carbon atoms, more preferably 1 to 20 carbon atoms, and particularly preferably 1 to 10 carbon atoms; for example, methoxy, ethoxy, butoxy, 2-ethylhexyloxy and the like), aryloxy ligands (preferably having 6 to 30 carbon atoms, more preferably 6 to 20 carbon atoms, and particularly preferably 6 to 12 carbon atoms; for example, phenyloxy, 1-naphthyloxy, 2-naphthyloxy, 2,4,6-trimethylphenyloxy, 4-biphenyloxy and the like), and the like.

Furthermore, there may be mentioned heteroaryloxy ligands (preferably having 1 to 30 carbon atoms, more preferably 1 to 20 carbon atoms, and particularly preferably 1 to 12 carbon atoms; for example, pyridyloxy, pyrazyloxy, pyrimidyloxy, quinolyloxy and the like), alkylthio ligands (preferably having 1 to 30 carbon atoms, more preferably 1 to 20 carbon atoms, and particularly preferably 1 to 12 carbon atoms; for example, methyltio, ethylthio and the like), arylthio ligands (preferably having 6 to 30 carbon atoms, more preferably 6 to 20 carbon atoms, and particularly preferably 6 to 12 carbon atoms; for example, phenylthio and the like), heteroarylthio ligands (preferably having 1 to 30 carbon atoms, more preferably 1 to 20 carbon atoms, and particularly preferably 1 to 12 carbon atoms; for example, pyridylthio, 2-benzimidazolylthio, 2-benzoxazolylthio, 2-benzothiazolylthio and the like), siloxy ligands (preferably having 1 to 30 carbon atoms, more preferably 3 to 25 carbon atoms, and particularly preferably 6 to 20 carbon atoms; for example, a triphenylsiloxy group, a triethoxysiloxy group, a triisopropylsiloxy group and the like), aromatic hydrocarbon anion ligands (preferably having 6 to 30 carbon atoms, more preferably 6 to 25 carbon atoms, and particularly preferably 6 to 20 carbon atoms; for example, a phenyl anion, a naphthyl anion, an anthranyl anion and the like), aromatic heterocyclic anion ligands (preferably having 1 to 30 carbon atoms, more preferably 2 to 25 carbon atoms, and particularly preferably 2 to 20 carbon atoms; for example, a pyrrole anion, a pyrazole anion, a triazole anion, an oxazole anion, a benzoxazole anion, a thiazole anion, a benzothiazole anion, a thiophene anion, a benzothiophene anion and the like), indolenine anion ligands, and the like. Preferred examples include nitrogen-containing heterocyclic ligands, aryloxy ligands, heteroaryloxy ligands, siloxy ligands, aromatic hydrocarbon anion ligands and aromatic heterocyclic anion ligands, while more preferred examples include nitrogen-containing heterocyclic ligands, aryloxy ligands, siloxy ligands, aromatic hydrocarbon anion ligands and aromatic heterocyclic anion ligands.

Examples of the metal complex host material having electron transportability include the compounds described in, for example, JP-A No. 2002-235076, JP-A No. 2004-214179, JP-A No. 2004-221062, JP-A No. 2004-221065, JP-A No. 2004-221068, JP-A No. 2004-327313, and the like.

Specific examples of such host material having electron transportability include the following materials, but are not limited to these.

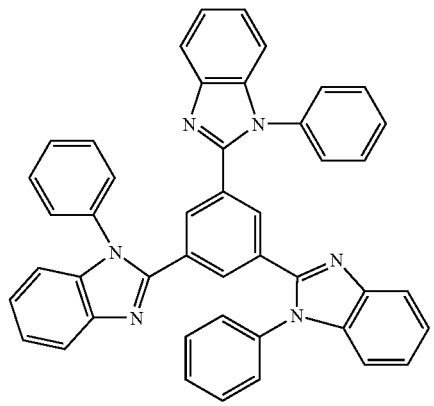

E-1

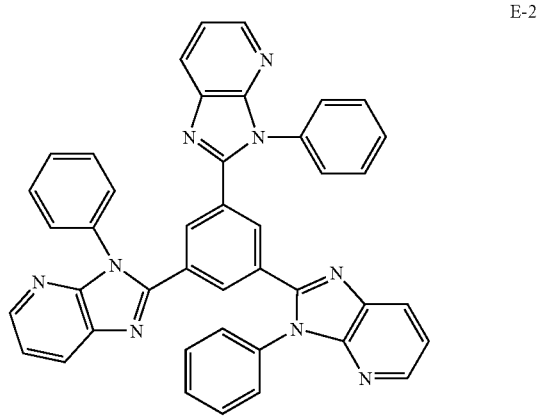

E-2

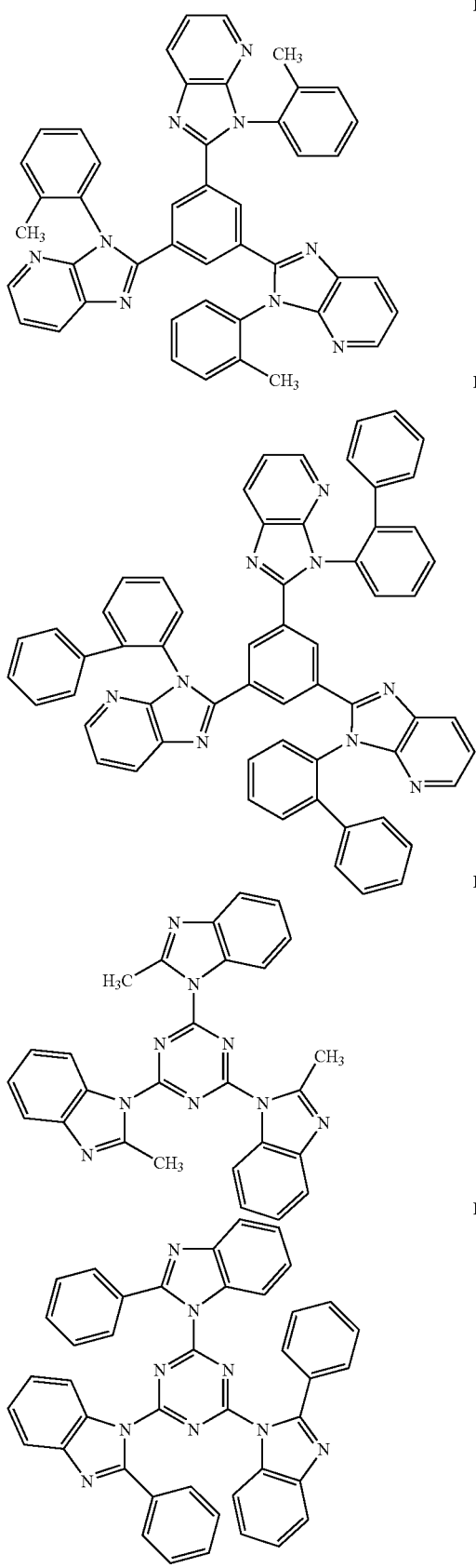
E-3
E-4
E-5
E-6
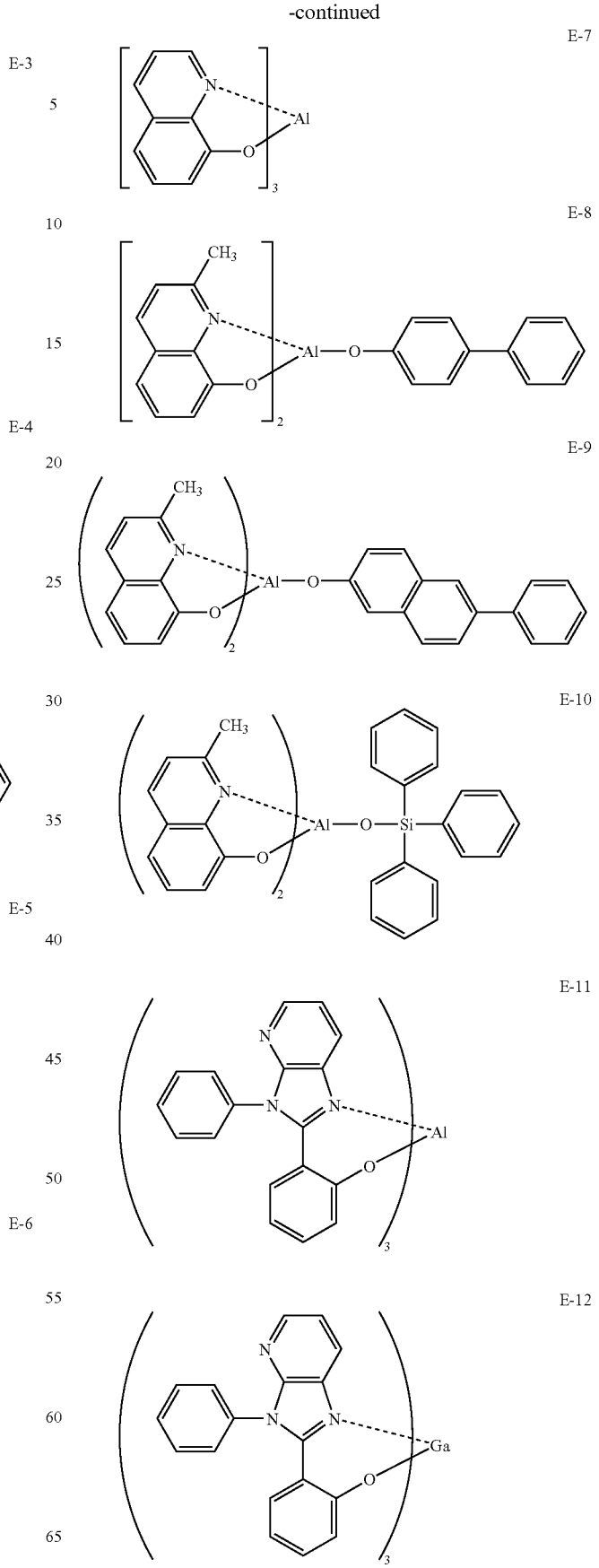
E-7
E-8
E-9
E-10
E-11
E-12

E-13 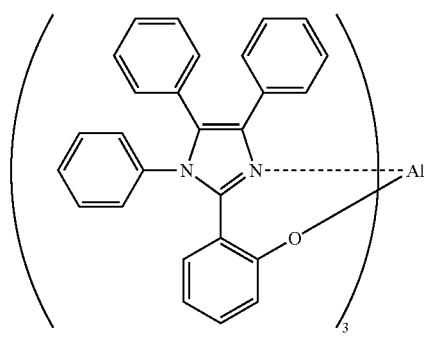
E-14 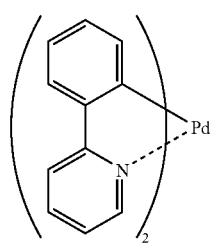
E-15 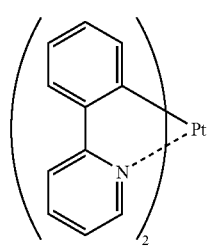
E-16 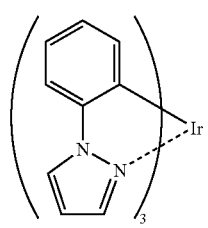
E-17 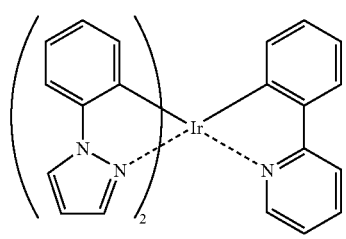
E-18 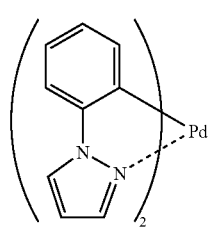
E-19 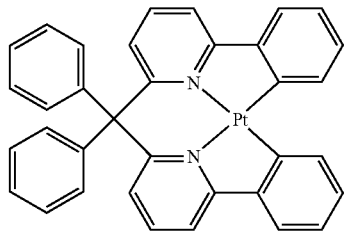
E-20 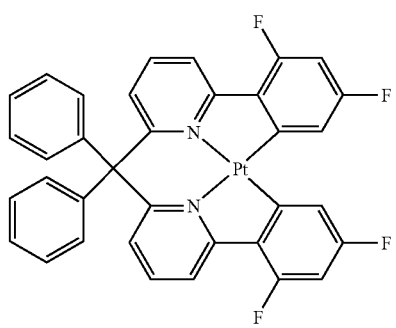
E-21 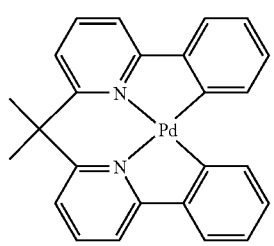
E-22 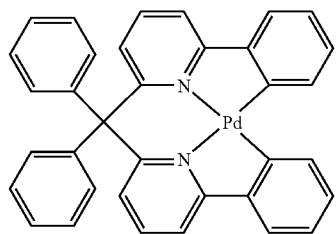
E-23 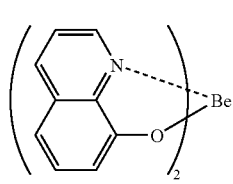
E-24 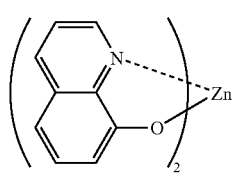

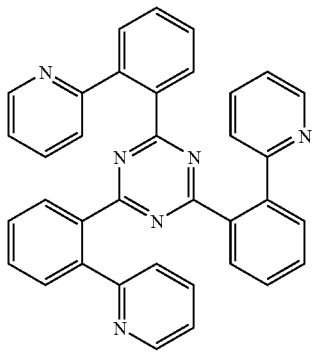

E-25

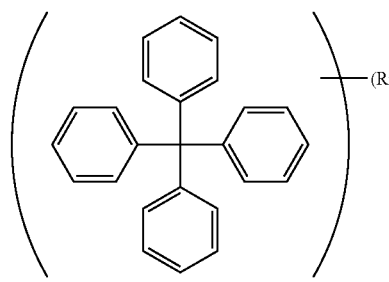

E-26

The host material having electron transportability is preferably a compound represented by any one of formulas E-1 to E-6, E-8, E-9, E-21 and E-22, more preferably any one of formulas E-3, E-4, E-6, E-8, E-9, E-10, E-21 and E-22, and even more preferably any one of formulas E-3, E-4, E-8, E-9, E-21 and E-22.

(C) Electrically Inert Material (Binder)

As for the electrically inert material included in the light emitting layer, any of an organic material and an inorganic material may be used.

The electrically inert material included in the light emitting layer is preferably an organic material having an energy difference Eg between the highest occupied molecular orbital and the lowest unoccupied molecular orbital of 4.0 eV or more, and more preferably is a material having an Eg of 4.1 eV or more (a) and 5.0 eV or less, and more preferably 4.2 eV or more and 5.0 eV or less. When the Eg is 4.0 eV or more, holes and/or electrons are prevented from penetrating into the inert material, and the carrier mobility may be appropriately maintained, thus the luminescence efficiency and durability being further increased.

An electrically inert organic material may be suitably selected from aromatic hydrocarbon compounds, and as one of such compound families, compounds represented by the following formula (1) may be mentioned.

L-(Ar)$_m$     Formula (1)

In the formula (1), Ar represents a group represented by the following formula (2); L represents a trivalent or higher valent benzene skeleton; and m represents an integer of 3 or greater.

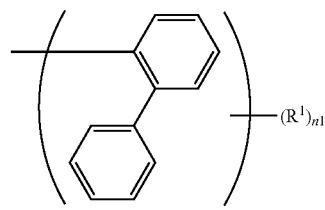

Formula (2)

In the formula (2), $R^1$ represents a substituent, and when $R^1$ is present in plurality, each $R^1$ may be identical with or different from another $R^1$; and n1 represents an integer from 0 to 9.

Another preferred compound family includes compounds represented by the following formula (3).

Formula (3)

In the formula (3), $R^2$ represents a substituent, and when $R^2$ is present in plurality, each $R^2$ may be identical with or different from another $R^2$; and n2 represents an integer from 0 to 20.

First, the formula (1) will be described in detail.

L included in the formula (1) represents a trivalent or higher valent benzene skeleton. Ar represents a group represented by the formula (2), and m represents an integer of 3 or greater. m is preferably 3 or more and 6 or less, and more preferably 3 or 4.

Next, the group represented by the formula (2) will be described.

$R^1$ included in the formula (2) represents a substituent. Here, examples of the substituent include an alkyl group (preferably having 1 to 30 carbon atoms, more preferably 1 to 20 carbon atoms, and particularly preferably 1 to 10 carbon atoms, and for example, methyl, ethyl, iso-propyl, tert-butyl, n-octyl, n-decyl, n-hexadecyl, cyclopropyl, cyclopentyl, cyclohexyl and the like), an alkenyl group (preferably having 2 to 30 carbon atoms, more preferably 2 to 20 carbon atoms, and particularly preferably 2 to 10 carbon atoms, and for example, vinyl, alkyl, 2-butenyl, 3-pentenyl and the like), an alkynyl group (preferably having 2 to 30 carbon atoms, more preferably 2 to 20 carbon atoms, and particularly preferably 2 to 10 carbon atoms, and for example, propargyl, 3-pentynyl and the like), an aryl group (preferably having 6 to 30 carbon atoms, more preferably 6 to 20 carbon atoms, and particularly preferably 6 to 12 carbon atoms, and for example, phenyl, p-methylphenyl, naphthyl, anthranyl and the like), and the like.

Furthermore, an amino group (preferably having 0 to 30 carbon atoms, more preferably 0 to 20 carbon atoms, and particularly preferably 0 to 10 carbon atoms, and for example, amino, methylamino, dimethylamino, diethylamino, dibenzylamino, diphenylamino, ditolylamino and the like), an alkoxy group (preferably having 1 to 30 carbon atoms, more preferably 1 to 20 carbon atoms, and particularly preferably 1 to 10 carbon atoms, and for example, methoxy, ethoxy, butoxy, 2-ethylhexyloxy and the like), an aryloxy group (preferably having 6 to 30 carbon atoms, more preferably 6 to 20 carbon atoms, and particularly preferably 6 to 12 carbon atoms, and for example, phenyloxy, 1-naphthyloxy, 2-naphthyloxy and the like), a heteroaryloxy group, (preferably having 1 to 30 carbons, more preferably 1 to 20 carbon atoms, and particularly preferably 1 to 12 carbon atoms, and for example, pyridyloxy, pyrazyloxy, pyrimidyloxy, quinolyloxy and the like), an acyl group (preferably having 1 to 30 carbon atoms, more preferably 1 to 20 carbon atoms, and particularly preferably 1 to 12 carbon atoms, and for example, acetyl, benzoyl, formyl, pivaloyl and the like), an alkoxycarbonyl group (preferably having 2 to 30 carbon atoms, more preferably 2 to 20 carbon atoms, and particularly preferably 2 to 12 carbon atoms, and for example, methoxycarbonyl, ethoxycarbonyl and the like), an aryloxycarbonyl group (preferably having 7 to 30 carbon atoms, more preferably 7 to 20 carbon atoms, and particularly preferably 7 to 12 carbon atoms, and for example, phenyloxycarbonyl and the like), may be mentioned.

There may also be mentioned an acyloxy group (preferably having 2 to 30 carbon atoms, more preferably 2 to 20 carbon atoms, and particularly preferably 2 to 10 carbon atoms, and for example, acetoxy, benzoyloxy and the like), an acylamino group (preferably having 2 to 30 carbon atoms, more preferably 2 to 20 carbon atoms, and particularly preferably 2 to 10 carbon atoms, and for example, acetylamino, benzoylamino and the like), an alkoxycarbonylamino group (preferably having 2 to 30 carbon atoms, more preferably 2 to 20 carbon atoms, and particularly preferably 2 to 12 carbon atoms, and for example, methoxycarbonylamino and the like), an aryloxycarbonylamino group (preferably having 7 to 30 carbon atoms, more preferably 7 to 20 carbon atoms, and particularly preferably 7 to 12 carbon atoms, and for example, phenyloxycarbonylamino and the like), and the like.

A sulfonylamino group (preferably having 1 to 30 carbon atoms, more preferably 1 to 20 carbon atoms, and particularly preferably 1 to 12 carbon atoms, and for example, methanesulfonylamino, benzenesulfonylamino and the like), a sulfamoyl group (preferably having 0 to 30 carbon atoms, more preferably 0 to 20 carbon atoms, and particularly preferably 0 to 12 carbon atoms, and for example, sulfamoyl, methylsulfamoyl, dimethylsulfamoyl, phenylsulfamoyl and the like), a carbamoyl group (preferably having 1 to 30 carbon atoms, more preferably 1 to 20 carbon atoms, and particularly preferably 1 to 12 carbon atoms, and for example, carbamoyl, methylcarbamoyl, diethylcarbamoyl, phenylcarbamoyl and the like), an alkylthio group preferably having 1 to 30 carbon atoms, more preferably 1 to 20 carbon atoms, and particularly preferably 1 to 12 carbon atoms, and for example, methylthio, ethylthio and the like), an arylthio group (preferably having 6 to 30 carbon atoms, more preferably 6 to 20 carbon atoms, and particularly preferably 6 to 12 carbon atoms, and for example, phenylthio and the like), a heteroarylthio group (preferably having 1 to 30 carbon atoms, more preferably 1 to 20 carbon atoms, and particularly preferably 1 to 12 carbon atoms, and for example, pyridylthio, 2-benzimidazolylthio, 2-benzoxazolylthio, 2-benzothiazolylthio and the like), and the like may be mentioned.

A sulfonyl group (preferably having 1 to 30 carbon atoms, more preferably 1 to 20 carbon atoms, and particularly preferably 1 to 12 carbon atoms, and for example, mesyl, tosyl and the like), a sulfinyl group (preferably having 1 to 30 carbon atom, more preferably 1 to 20 carbon atoms, and particularly preferably 1 to 12 carbon atoms, and for example, methanesulfinyl, benzenesulfinyl and the like), a ureido group (preferably having 1 to 30 carbon atoms, more preferably 1 to 20 carbon atoms, and particularly preferably 1 to 12 carbon atoms, and for example, ureido, methylureido, phenylureido and the like), a phosphoric acid amide group (preferably having 1 to 30 carbon atoms, more preferably 1 to 20 carbon atoms, and particularly preferably 1 to 12 carbon atoms, and for example, diethylphosphoric acid amide, phenylphosphoric acid amide and the like), and the like may be mentioned.

A hydroxyl group, a mercapto group, a halogen atom (for example, a fluorine atom, a chlorine atom, a bromine atom or an iodine atom), a cyano group, a sulfo group, a carboxyl group, a nitro group, a hydroxamic acid group, a sulfino group, a hydrazino group, an imino group, a heterocyclic group (preferably having 1 to 30 carbon atoms, more preferably 1 to 12 carbon atoms, and having a nitrogen atom, an oxygen atom, a sulfur atom or the like for example as the heteroatom; specifically, for example, imidazolyl, pyridyl, quinolyl, furyl, thienyl, piperidyl, morpholino, benzoxazolyl, benzimidazolyl, benzothiazolyl, a carbazolyl group, an azepinyl group and the like), a silyl group (preferably having 3 to 40 carbon atoms, more preferably 3 to 30 carbon atoms, and particularly preferably 3 to 24 carbon atoms, and for example, trimethylsilyl, triphenylsilyl and the like), and the like may be mentioned.

When $R^1$ is present in plurality, each $R^1$ may be identical with or different from another $R^1$, and they may be joined to form a ring. Further, $R^1$ may be further substituted.

n1 represents an integer from 0 to 9. n1 is preferably an integer from 0 to 6, and more preferably 0 to 3.

Subsequently, the formula (3) will be described.

In the formula (3), $R^2$ represents a substituent. The substituent $R^2$ has the same meaning as the substituent $R^1$, including the preferred embodiments.

n2 represents an integer from 0 to 20. A preferred range of n2 is from 0 to 10, and more preferably from 0 to 5.

Examples of the compound of formula (1) or formula (3) will be shown below, but the invention is not intended to be limited to these.

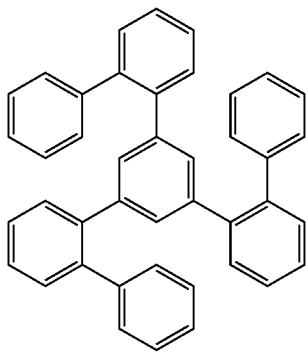
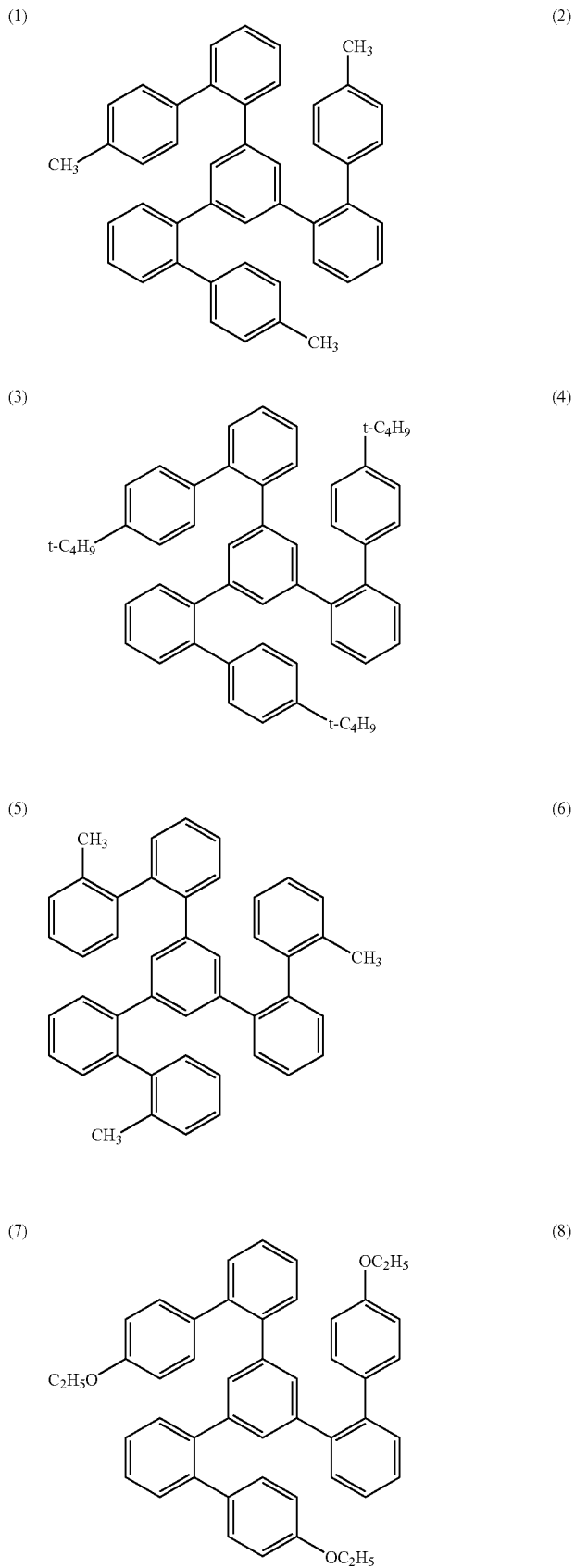

-continued
(9)
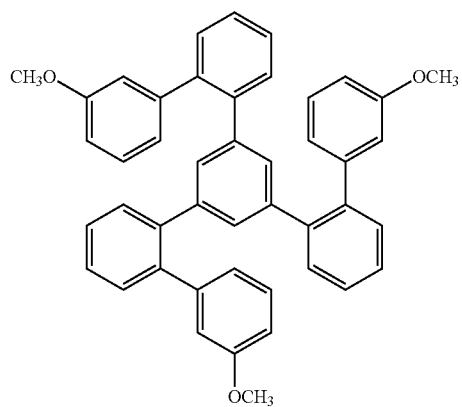
(10)
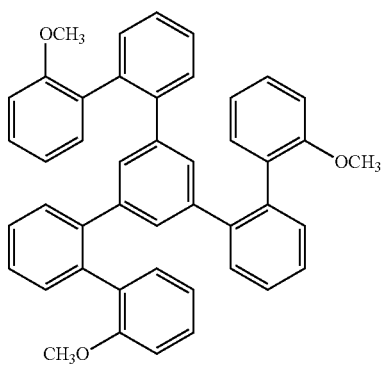
(11)
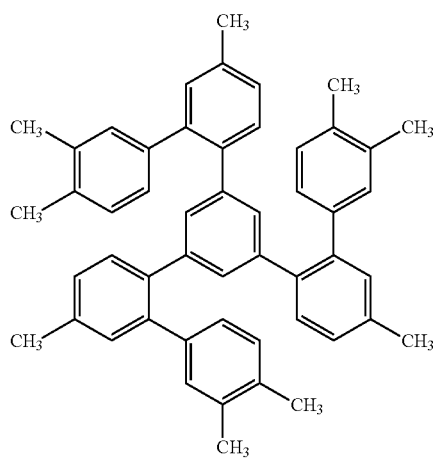
(12)
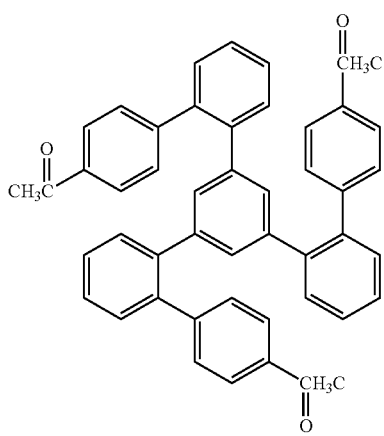
(13)
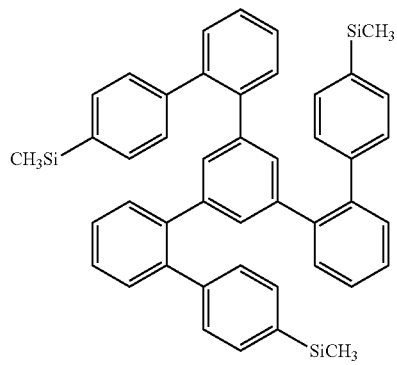
(14)
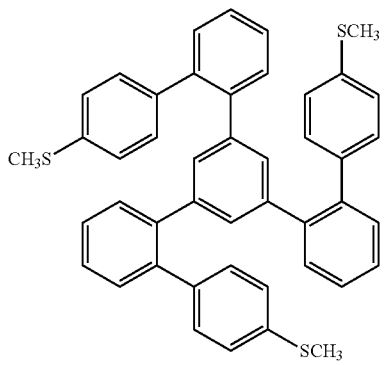
(15)
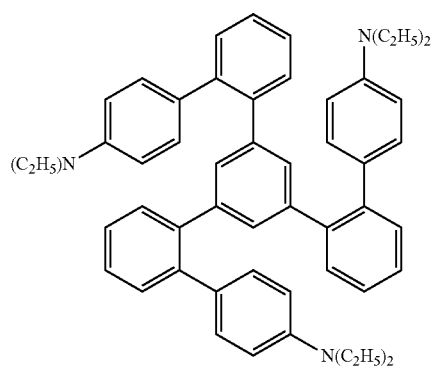
(16)
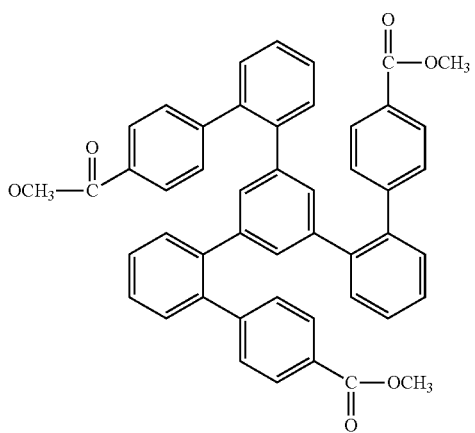

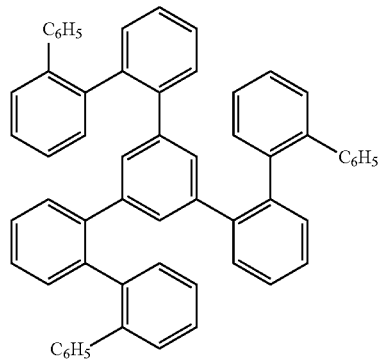
(17)
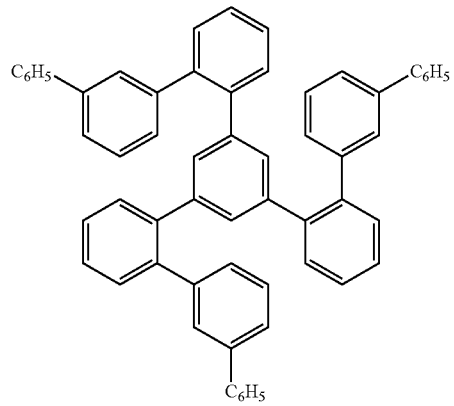
(18)
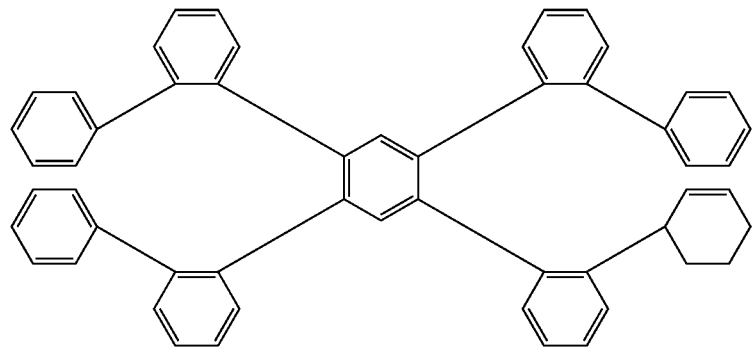
(19)
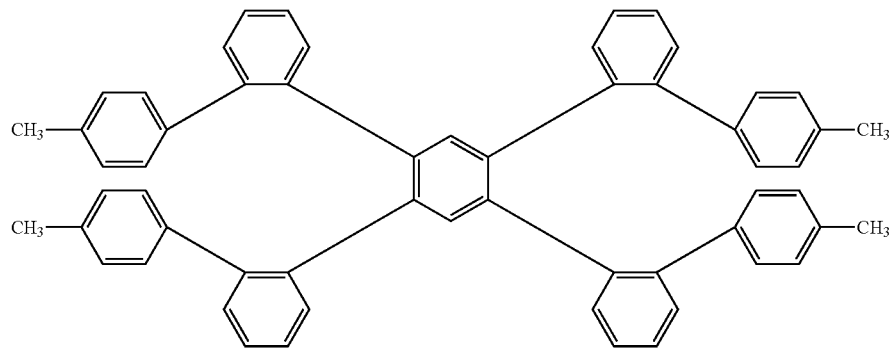
(20)
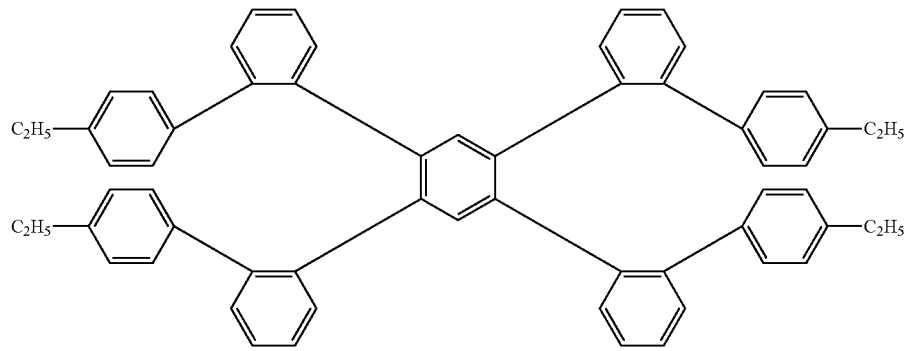
(21)

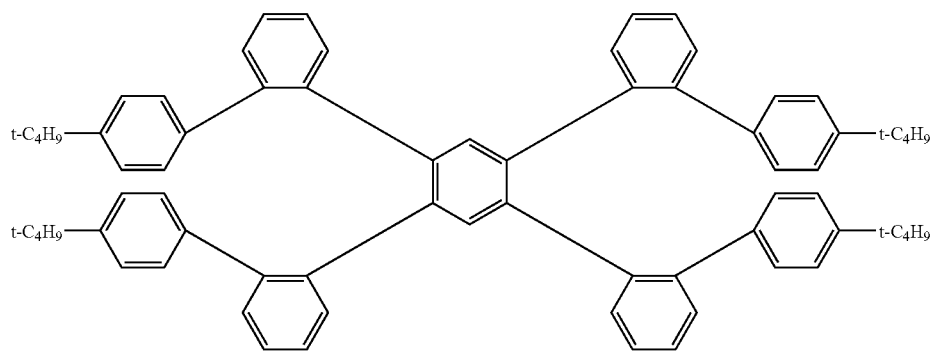
(22)
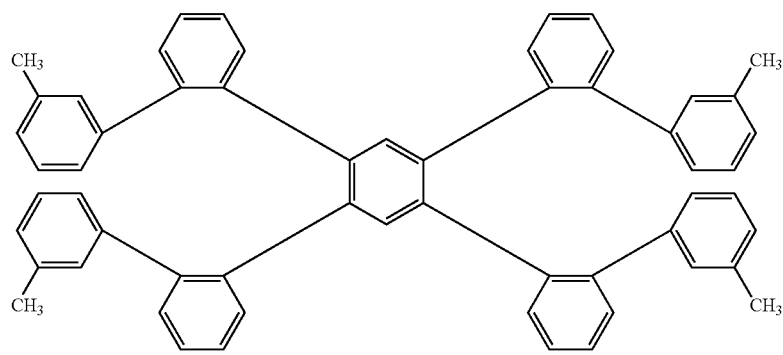
(23)
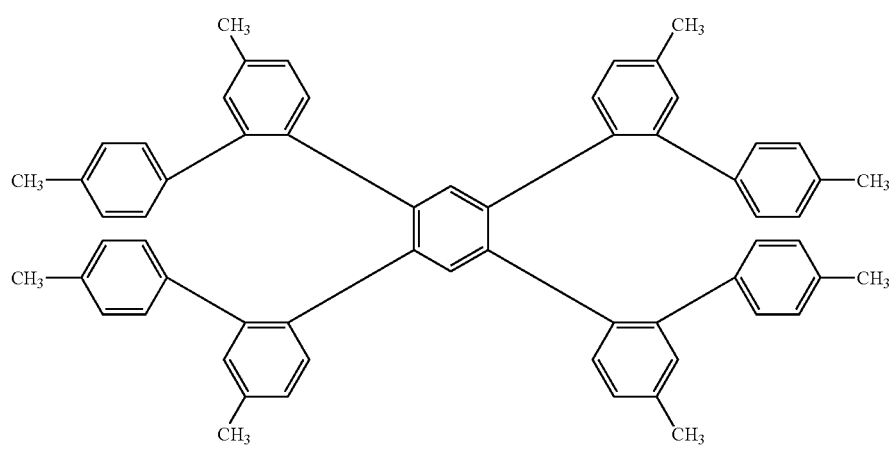
(24)
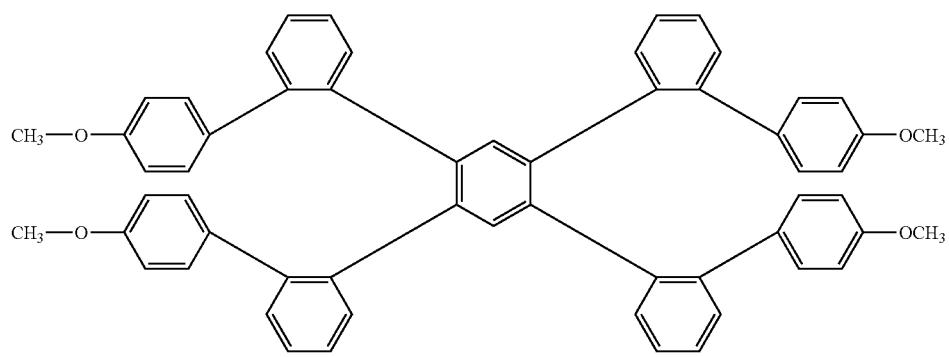
(25)

(26)
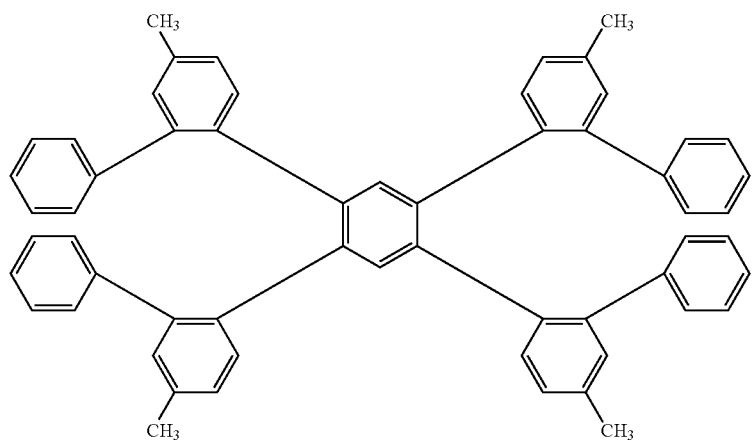
(27)
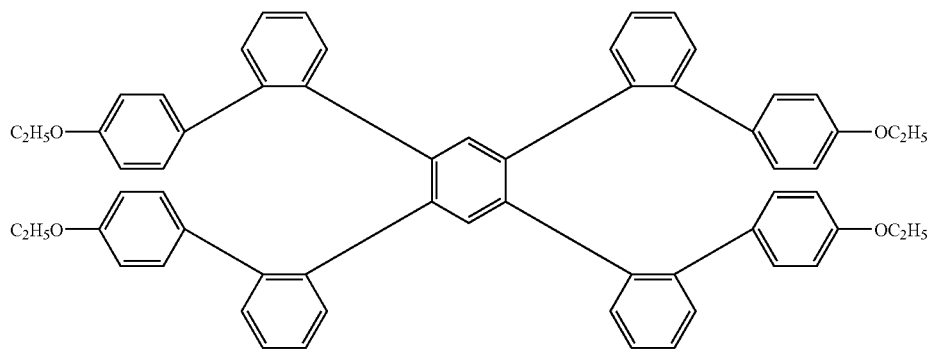
(28)
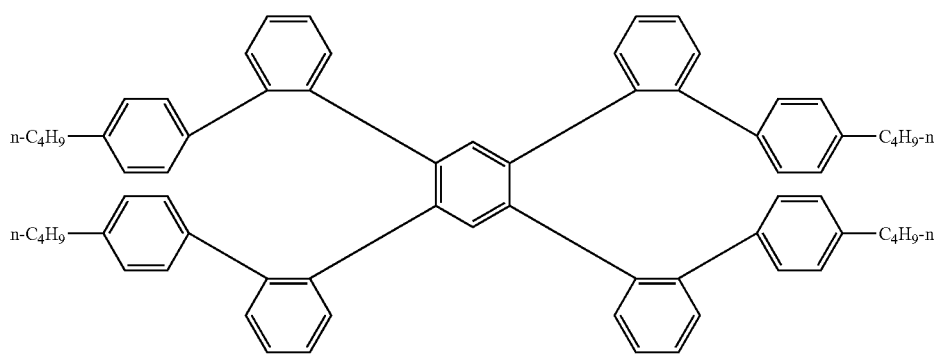
(29)
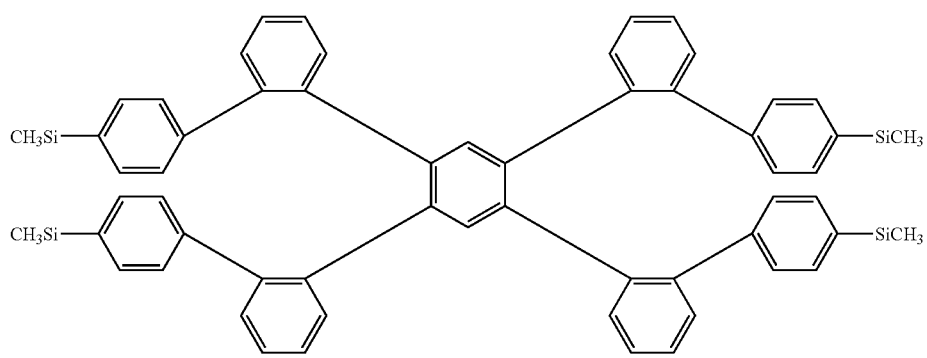

(30)
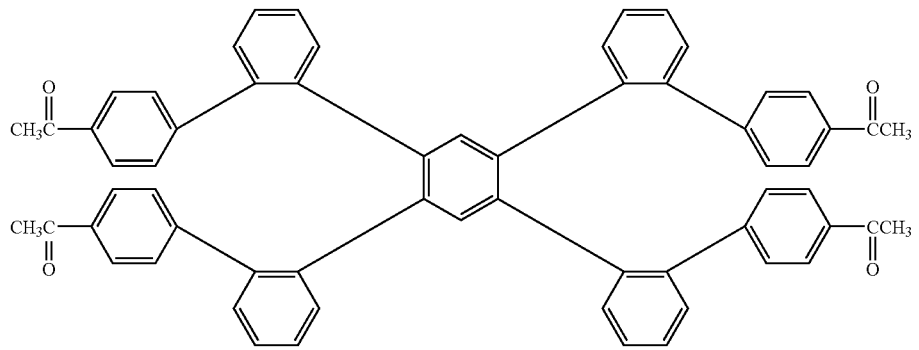
(31)
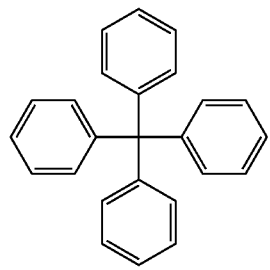
(32)
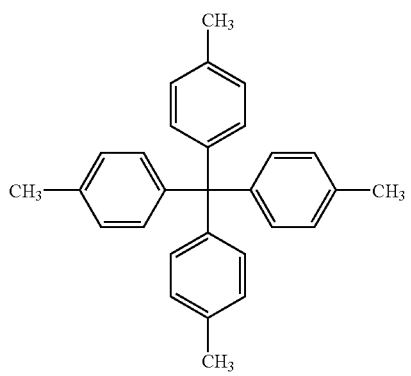
(33)
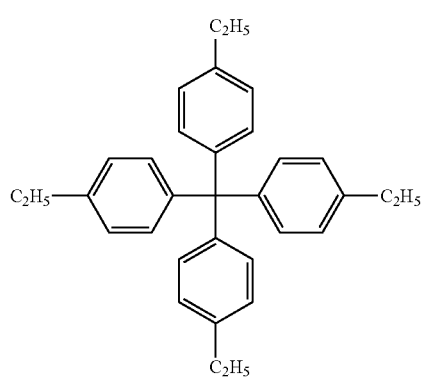
(34)
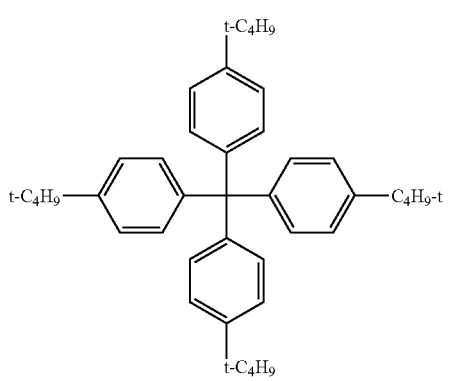
(35)
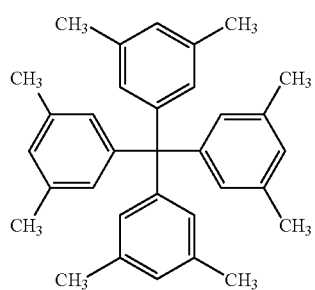
(36)
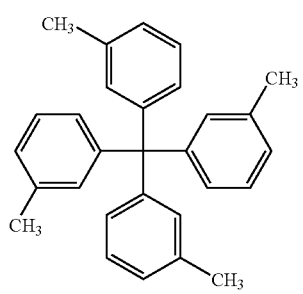

-continued
(37)
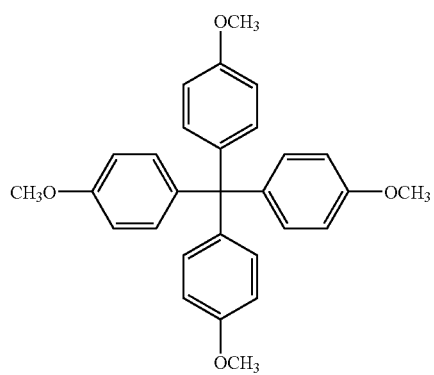
(38)
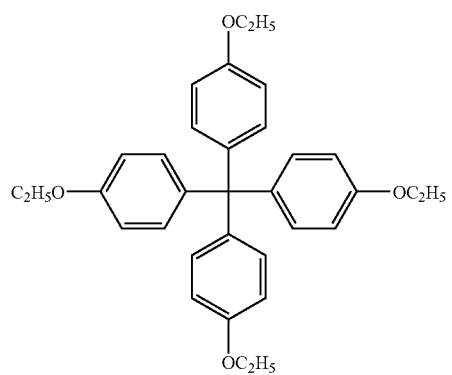
(39)
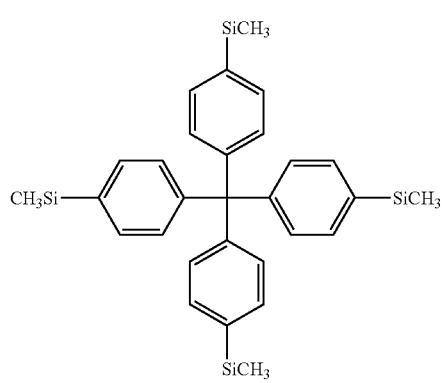
(40)
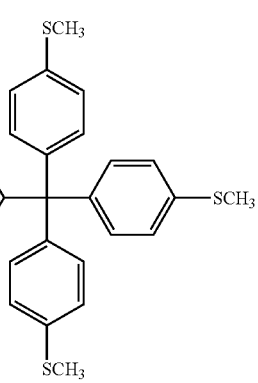
(41)
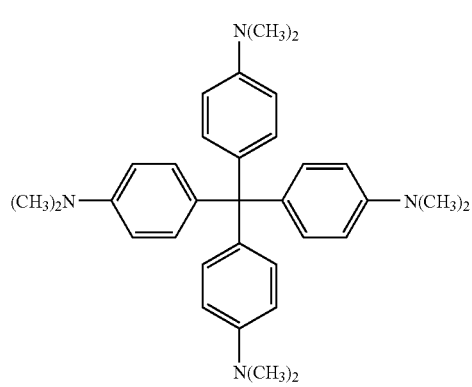
(42)
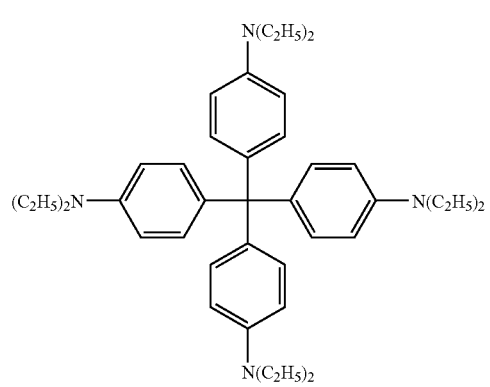
(43)
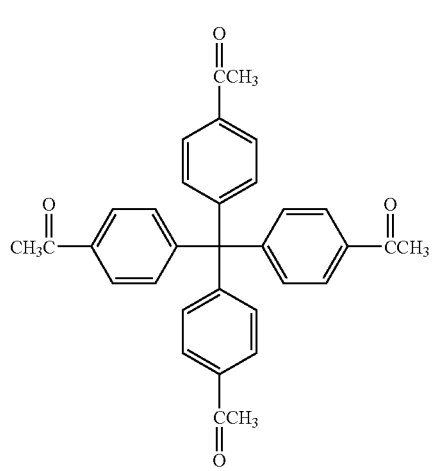
(44)
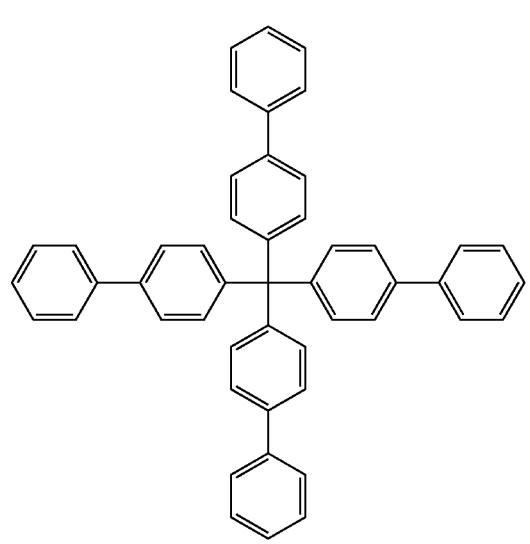

-continued
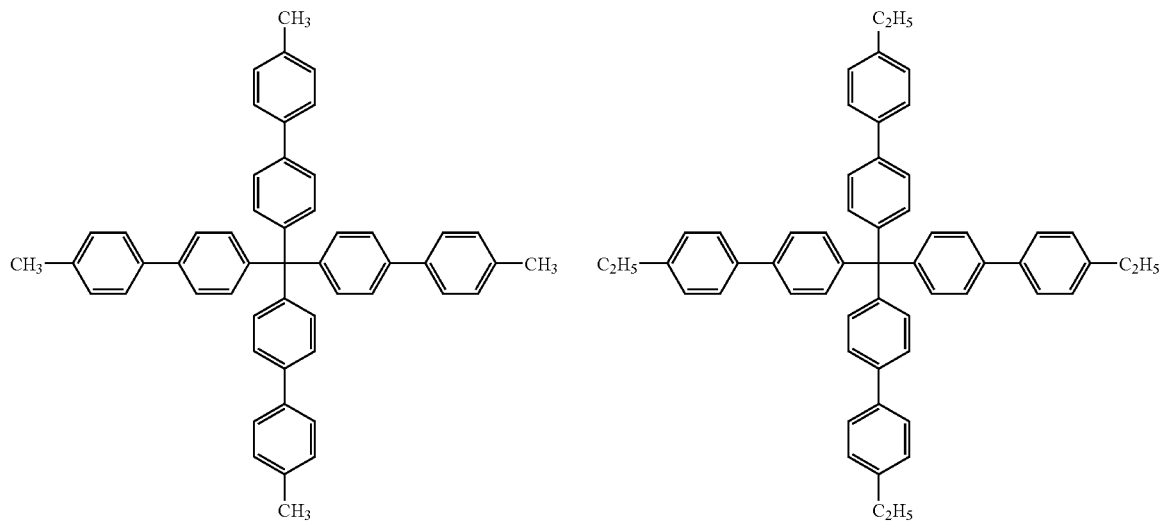
(45) (46)
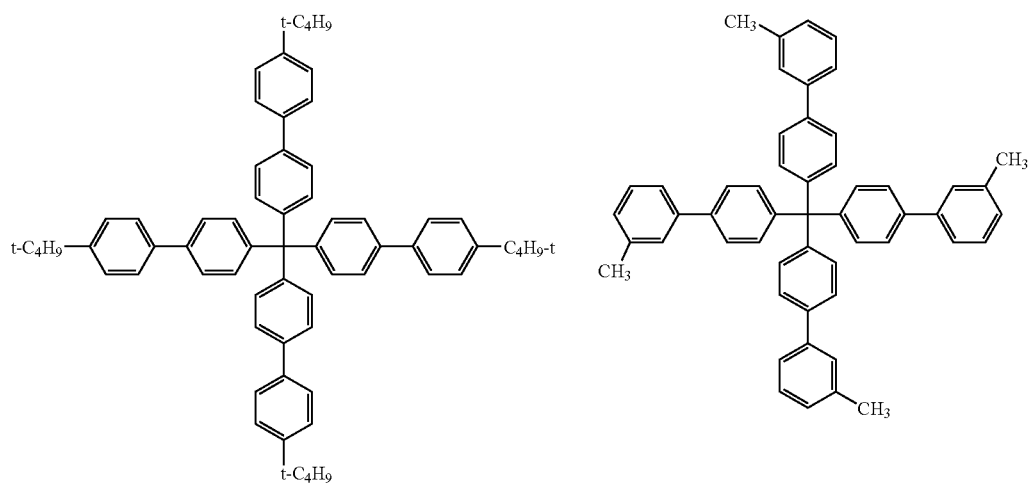
(47) (48)
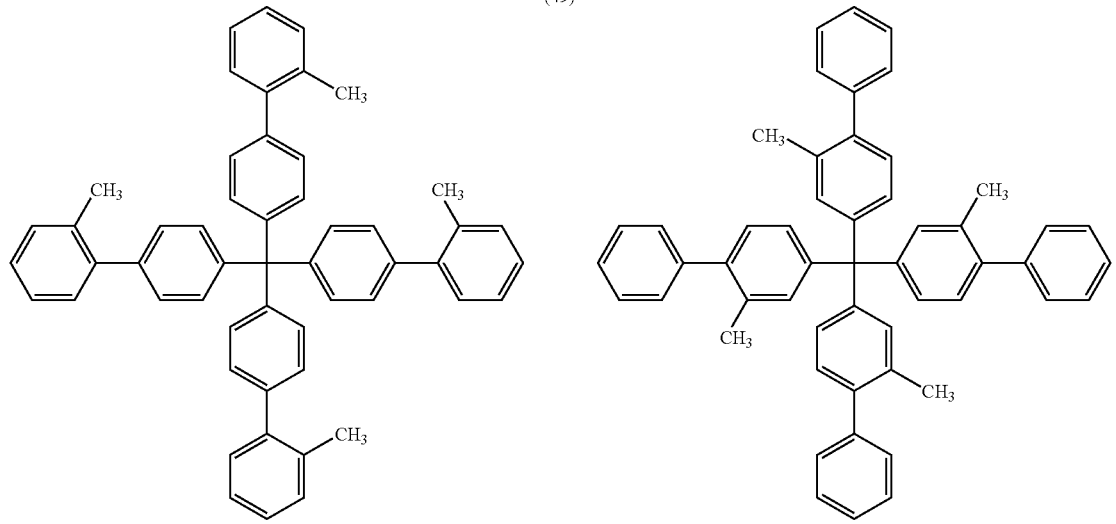
(49) (50)

-continued
(51)
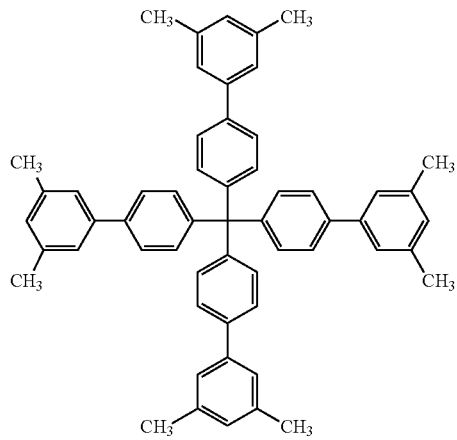
(52)
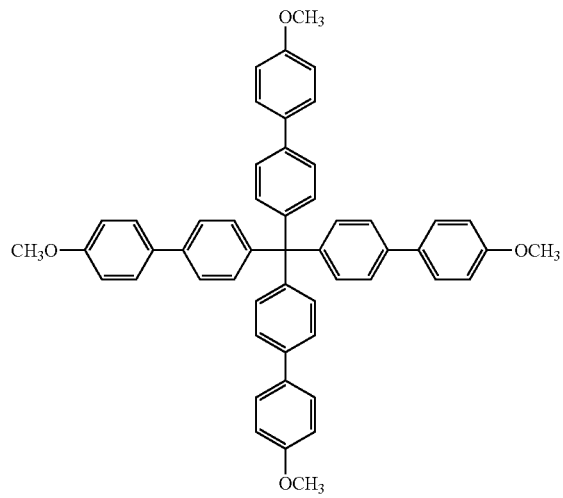
(53)
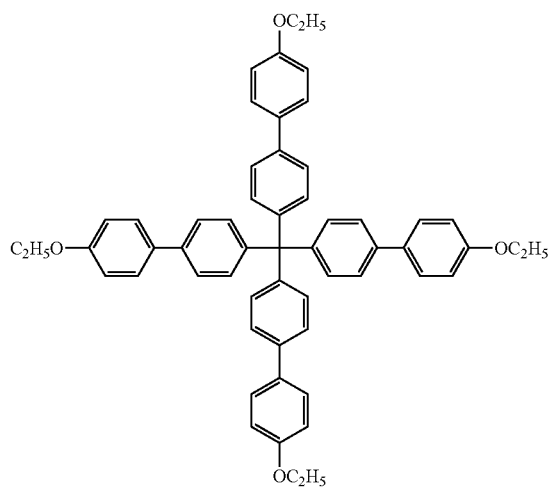
(54)
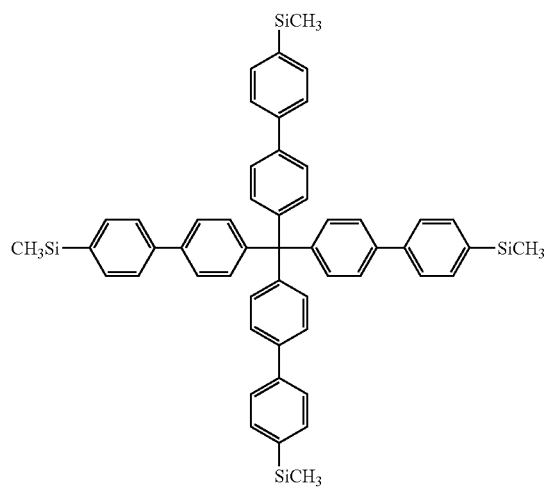
(55)
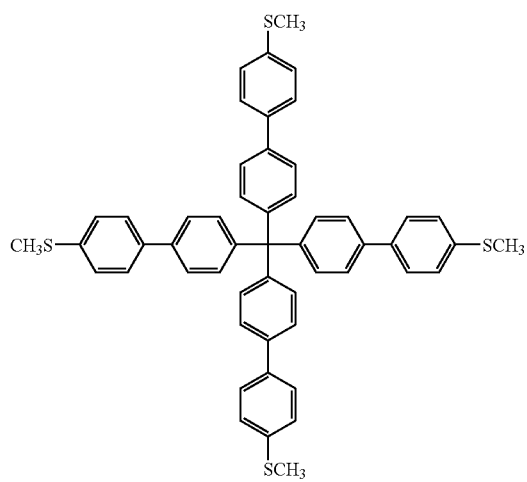
(56)
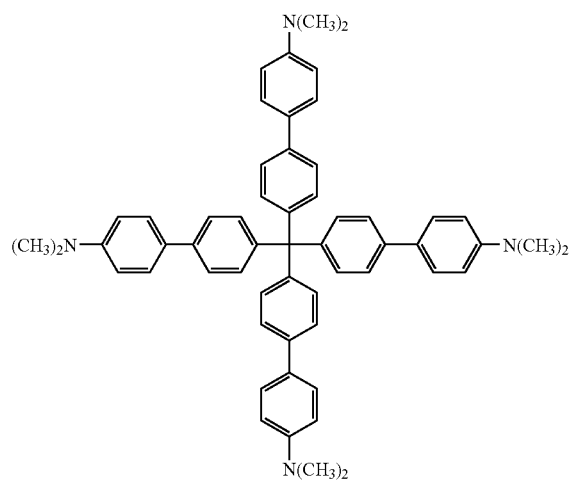

(57)

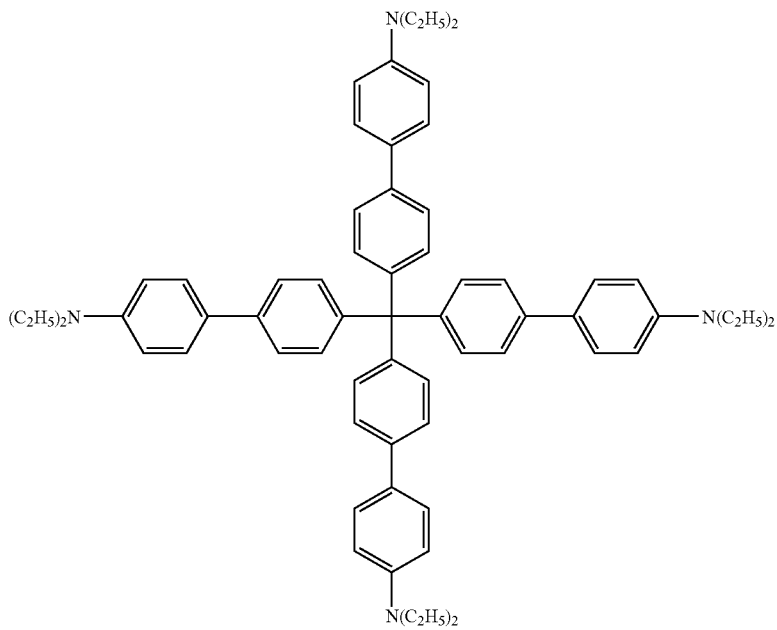

(58)

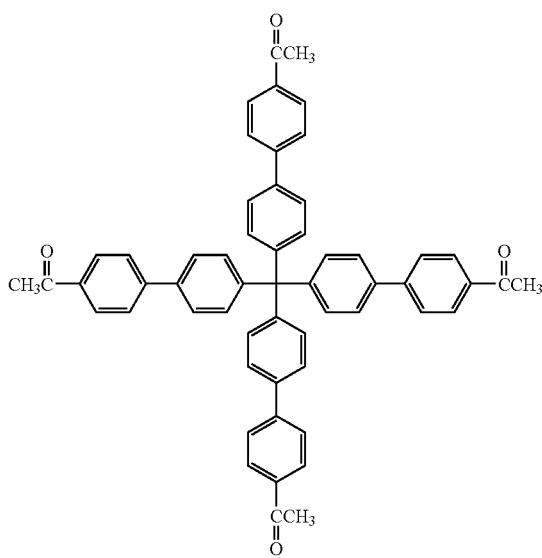

Another electrically inert organic material may be suitably selected from siloxane compounds. Examples of the compound will be shown below, but the invention is not intended to be limited to these.

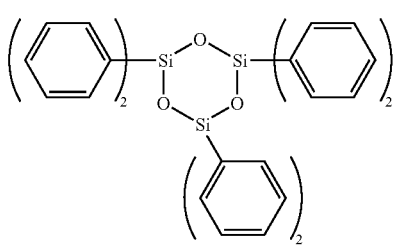

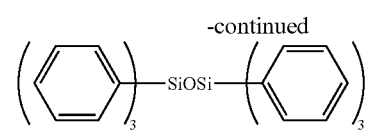

Meanwhile, the electrically inert inorganic material that may be included in the light emitting layer, is not particularly limited as long as it is an inorganic dielectric material having substantially no conductivity.

As for the inorganic material, for example, metal oxides, metal nitrides, metal carbides, metal halides, metal sulfates, metal nitrates, metal phosphates, metal sulfides, metal carbonates, metal borohalides, metal phosphohalides and the like may be used. Among them, from the viewpoint of the compatibility with light emitting materials or the adaptability for film formation, silicon oxide, silicon dioxide, silicon nitride, silicon oxynitride, silicon carbide, germanium oxide, germanium dioxide, tin oxide, tin dioxide, barium oxide, lithium fluoride, lithium chloride, cesium fluoride, cesium chloride and the like are preferred. More preferred are silicon nitride, silicon oxynitride, silicon oxide and silicon carbide. Zinc sulfide (ZnS) is also suitable.

Using (A) a light emitting material having electron transportability, (B) a host material having hole transportability and (C) an electrically inert material as described above, a light emitting layer is formed such that the concentration of the light emitting material having hole transportability gradually increases from the cathode side toward the anode side. The method of forming such light emitting layer is not particularly limited if the light emitting layer may be formed such that the concentration of the light emitting material having hole transportability has a concentration gradient as described above, and any of dry film forming methods such as deposition methods or sputtering methods, transfer methods, printing methods and the like may be favorably used, with co-deposition being suitable. In the case of co-deposition, when the rate of deposition of each material is controlled, the light emitting layer may be formed to have a desired concentration distribution in the thickness direction thereof.

Although the thickness of the light emitting layer is not particularly limited, but usually, from the viewpoints of preventing the generation of pinholes in the light emitting layer, obtaining a sufficient luminescence intensity, and the like, the thickness is preferably 1 nm to 500 nm, more preferably 5 nm to 200 nm, and even more preferably 10 nm to 100 nm.

—Hole Injection Layer and Hole Transport Layer—

The hole injection layer and the hole transport layer are layers having a function of receiving holes from the anode 14 or from the anode side, and transporting the holes to the light emitting layer side (cathode side). Specifically, the hole injection layer and the hole transport layer are preferably layers containing a pyrrole derivative, a carbazole derivative, an indole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine, a porphyrin compound, an organic silane derivative, various metal complexes having carbon, phenylazole or phenylazine as the ligand, represented by Ir complexes, or the like.

The hole injection layer and/or hole transport layer of the organic EL device of the invention may preferably contain an electron accepting dopant, from the viewpoint of voltage lowering and driving durability.

As long as the electron accepting dopant introduced into the hole injection layer or hole transport layer has a property of accepting an electron and oxidizing an organic compound, any of an inorganic compound and an organic compound may be used. Specific examples of the inorganic compound that may be suitably used include halides such as iron (II) chloride, aluminum chloride, gallium chloride, indium chloride and antimony pentachloride, and metal oxides such as vanadium pentoxide and molybdenum trioxide.

If the dopant is an organic compound, a compound having a nitro group, halogen, a cyano group or a trifluoromethyl group as the substituent, a quinone compound, an acid anhydride compound, fullerene or the like may be suitably used.

Specific examples thereof include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, fullerene C70 and the like. In addition to these, the compounds described in JP-A No. 6-212153, JP-A No. 11-111463, JP-A No. 11-251067, JP-A No. 2000-196140, JP-A No. 2000-286054, JP-A No. 2000-315580, JP-A No. 2001-102175, JP-A No. 2001-160493, JP-A No. 2002-252085, JP-A No. 2002-56985, JP-A No. 2003-157981, JP-A No. 2003-217862, JP-A No. 2003-229278, JP-A No. 2004-342614, JP-A No. 2005-72012, JP-A No. 2005-166637, JP-A No. 2005-209643 and the like may be suitably used.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and C60 are preferred, and hexacyanobutadiene, hexacyanobelizene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferred, with tetrafluorotetracyanoquinodimethane being particularly preferred.

These electron accepting dopants may be used individually, or may be used in combination of two or more species. The amount of use of the electron accepting dopant may vary depending on the type of material, but is preferably 0.01% by mass to 50% by mass, more preferably 0.05% by mass to 20% by mass, and particularly preferably 0.1% by mass to 10% by mass, based on the material of the hole transport layer. If the amount of use is less than 0.01% by mass based on the hole transporting material, the effect of the invention is insufficient, and thus it is not preferable. If the amount of use exceeds 50% by mass, the ability to transport holes is impaired, and thus it is not preferable.

It is preferable that the thicknesses of the hole injection layer and the hole transport layer are respectively 500 nm or less, from the viewpoint of lowering the driving voltage.

The thickness of the hole transport layer is preferably 1 nm to 500 nm, more preferably 5 nm to 200 nm, and even more preferably 5 nm to 100 nm. The thickness of the hole injection layer is preferably 0.1 nm to 500 nm, more preferably 0.5 nm to 400 nm, and even more preferably 1 nm to 300 nm.

Each of the hole injection layer and the hole transport layer may have a single layer structure formed from one or two or more species of the materials mentioned above, or may also have a multilayer structure including plural layers having identical composition or different compositions.

—Electron Injection Layer, and Electron Transport Layer—

The electron injection layer and the electron transport layer are layers having a function of receiving electrons from the cathode 18 or from the cathode side, and transporting the electrons to the light emitting layer side (anode side). The electron injection layer and the electron transport layer are preferably layers containing, specifically, a triazole derivative, an oxazole derivative, an oxadiazole derivative, an imidazole derivative, a fluorenone derivative, an anthraquinodimethane derivative, an anthrone derivative, a diphenylquinone derivative, a thiopyrane dioxide derivative, a carbodiimide derivative, a fluorenylidenemethane derivative, a distyrylpyrazine derivative, an aromatic ring tetracarboxylic acid anhydride of naphthalene, perylene or the like, a phthalocyanine derivative, or various metal complexes represented by metal complexes of 8-quinole derivatives, metal phthalocyanine, and metal complexes having benzoxazole or benzothiazole as the ligand, an organic silane derivative, or the like.

The electron injection layer and/or electron transport layer of the organic EL device of the invention preferably contains an electron donating dopant from the viewpoint of lowering the voltage and improving the driving durability.

It is preferable that the electron donating dopant introduced into the electron injection layer or electron transport layer has a property of donating an electron and reducing an organic compound. An alkali metal such as Li, an alkaline earth metal such as Mg, a transition metal including a rare earth metal, a reducing organic compound or the like is suitably used.

As for the metal, particularly a metal having a work function of 4.2 eV or less may be suitably used, and specifically, Li, Na, K, Be, Mg, Ca, Sr, Ba, Y, Cs, La, Sm, Gd, Yb and the like may be mentioned.

As for the reducing organic compound, for example, a nitrogen-containing compound, a sulfur-containing compound, a phosphorus-containing compound and the like may be mentioned. In addition to these, the materials described in JP-A No. 6-212153, JP-A No. 2000-196140, JP-A No. 2003-68468, JP-A No. 2003-229278 JP-A No. 2004-342614 and the like may be used.

These electron donating dopants may be used individually, or may be used in combination of two or more species. The amount of use of the electron donating dopant may vary depending on the type of material, but the amount is preferably 0.1% by mass to 99% by mass, more preferably 1.0% by mass to 80% by mass, and particularly preferably 2.0% by mass to 70% by mass, based on the material of the electron transport layer. If the amount of use is less than 0.1% by mass based on the material of the electron transport layer, the effect of the invention is insufficient, and thus it is not preferable. If the amount of use exceeds 99% by mass, the ability to transport electrons is impaired, and thus it is not preferable.

It is preferable that the thicknesses of the electron injection layer and the electron transport layer are respectively 500 nm or less, from the viewpoint of lowering the driving voltage.

The thickness of the electron transport layer is preferably 1 nm to 500 nm, more preferably 5 nm to 200 nm, and even more preferably 10 nm to 100 nm. The thickness of the electron injection layer is preferably 0.1 nm to 200 nm, more preferably 0.2 nm to 100 nm, and even more preferably 0.5 nm to 50 nm.

The electron injection layer and the electron transport layer may have a single layer formed from one or two or more species of the materials mentioned above, or may also have a multilayer structure including plural layers having identical composition or different compositions.

—Hole Blocking Layer—

The hole blocking layer is a layer having a function of preventing the holes transported to the light emitting layer from the anode side from passing through to the cathode side. The hole blocking layer may be provided to be adjacent to the cathode side of the light emitting layer.

Examples of the organic compound constituting the hole blocking layer include an aluminum complex such as BAlq, a triazole derivative, a phenanthroline derivative such as BCP, and the like.

The thickness of the hole blocking layer is preferably 1 nm to 500 nm, more preferably 3 nm to 200 nm, and even more preferably 5 nm to 50 nm.

The hole blocking layer may have a single layer structure formed from one or two or more species of the materials mentioned above, or may also have a multilayer structure including plural layers having identical composition or different compositions.

—Cathode—

The cathode 18 generally has a function as an electrode for injecting electrons to the organic layer 16, and is not particularly limited in the shape, structure, size or the like, and the constituent material may be appropriately selected from known electrode materials in accordance with the use, purpose or the like of the organic EL device 10. Examples of the material constituting the cathode 18 include metals, alloys, metal oxides, electrically conductive compounds, mixtures thereof and the like. Specific examples thereof include an alkali metal (for example, Li, Na, K, Cs or the like), an alkaline earth metal (for example, Mg, Ca or the like), gold, silver, lead, aluminum, a sodium-potassium alloy, a lithium-aluminum alloy, a magnesium-silver alloy, indium, a rare earth metal such as ytterbium, and the like. These may be used individually and alone, but from the viewpoint of achieving a balance between stability and electron injectability, two or more species may be suitably used in combination.

Among these, the material constituting the cathode 18 is preferably an alkali metal or an alkaline earth metal from the viewpoint of electron injectability, or is preferably a material mainly containing aluminum from the viewpoint of excellent storage stability. The material mainly containing aluminum refers to aluminum only, or an alloy of aluminum with 0.01 to 10% by mass of an alkali metal or alkaline earth metal, or a mixture thereof (for example, a lithium-aluminum alloy, a magnesium-aluminum alloy or the like).

In addition, the materials for the cathode 18 are described in detail in, for example, JP-A No. 2-15595 and JP-A No. 51-121172, and the materials described in these publications may be applied to the invention as well.

The method for forming the cathode 18 is not particularly limited, and the cathode may be formed according to a known method. The cathode may be formed according to a method selected from, for example, wet methods such as a printing method or a coating method, physical methods such as vacuum deposition, sputtering or ion plating, chemical methods such as CVD or plasma CVD, and the like, while taking into consideration of the adaptability to the material constituting the cathode 18. For example, in the case of selecting a metal or the like as the material for the cathode 18, one or two or more species may be used simultaneously or sequentially to form the cathode 18 by a sputtering method or the like.

The thickness of the cathode 18 may be appropriately selected according to the material constituting the cathode 18 or the direction of light extraction, and is typically about 1 nm to 5 μm.

Patterning at the time of forming the cathode 18 may be carried out by chemical etching based on photolithography or the like, or may also be carried out by physical etching by means of laser or the like. Furthermore, patterning may also be carried out by vacuum deposition or sputtering with a mask superimposed thereon, and it is also acceptable to carry out a lift-off method or a printing method.

The position of formation of the cathode 18 is not particularly limited, and the cathode may be formed over the whole of the organic layer 16, or may be formed on a part thereof.

A dielectric layer formed from the fluoride, oxide or the like of an alkali metal or an alkaline earth metal may be formed between the cathode 18 and the organic EL layer 16, to a thickness of 0.1 to 5 nm. This dielectric layer may be interpreted as a kind of electron injection layer The dielectric layer may be formed by, for example, vacuum deposition, sputtering, ion plating or the like.

As a lower electrode 14, an organic layer 16 and an upper electrode 18 are sequentially formed in this order on a supporting substrate 12, an organic EL device 10 having an organic layer 16 including at least a light emitting layer sandwiched between a pair of electrodes 14 and 18 facing each other as shown in FIG. 1, is formed. Thereby, the light emitting layer sandwiched between the electrodes 14 and 18 on the supporting substrate 12, emits light. For example, when light emitting layers corresponding to various colors are formed such that RGB is repeatedly disposed in parallel on the substrate 12, the organic EL device having the light emitting layers sandwiched between the two electrodes 14 and 18, constitutes a pixel.

—Sealing and the Like—

After forming a cathode 18 on the organic layer 16, it is preferable to seal the organic device by coating it with a sealing member (protective layer), in order to suppress deterioration of the organic EL device caused by moisture or oxygen. As for the sealing member, glass, metals, plastics and the like may be used.

Furthermore, an external line such as a control wiring or a signal line is connected to each of the electrodes 14 and 18. Thereby, a display apparatus based on the organic EL device may be produced.

The organic EL device produced by the method as described above has a luminescence distribution in the light emitting layer approaching the luminescence in the entirety, and thus may have improved luminescence efficiency and durability. Particularly, in the case of phosphorescent device, the luminescence efficiency and durability may be improved, and also a decrease in the luminescence efficiency in high current regions may be very effectively prevented.

EXAMPLES

Hereinafter, Examples and Comparative Examples of the present invention will be described, but the invention is not intended to be limited to the following Examples.

Additionally, in the following Examples and Comparative Examples, "x %→y %" implies that when the concentration at the anode side (% by mass) is designated as x %, and the concentration at the cathode side (% by mass) is designated as y %, the concentration changes continuously from the anode side toward the cathode side.

Example 1

An ITO film (thickness 100 nm) is formed as an anode on a supporting substrate (material: glass), and then using a vacuum deposition apparatus ($1\times10^{-6}$ torr), co-deposition was performed thereon using 2-TNATA (4,4',4"-tris(2-naphtylphenylamino)triphenylamine), and F4-TCNQ (tetrafluorotetracyanoquinodimethane) in an amount of 1.0% by mass based on 2-TNATA, to form a hole injection layer having a thickness of 160 nm. Subsequently, a film of NPD (N,N'-dinaphthyl-N,N'-diphenyl-[1,1'-biphenyl]-4,4'-diamine) was formed as a hole transport layer having a thickness of 10 nm. The structural formulas of 2-TNATA, F4-TCNQ and NPD are as follows.

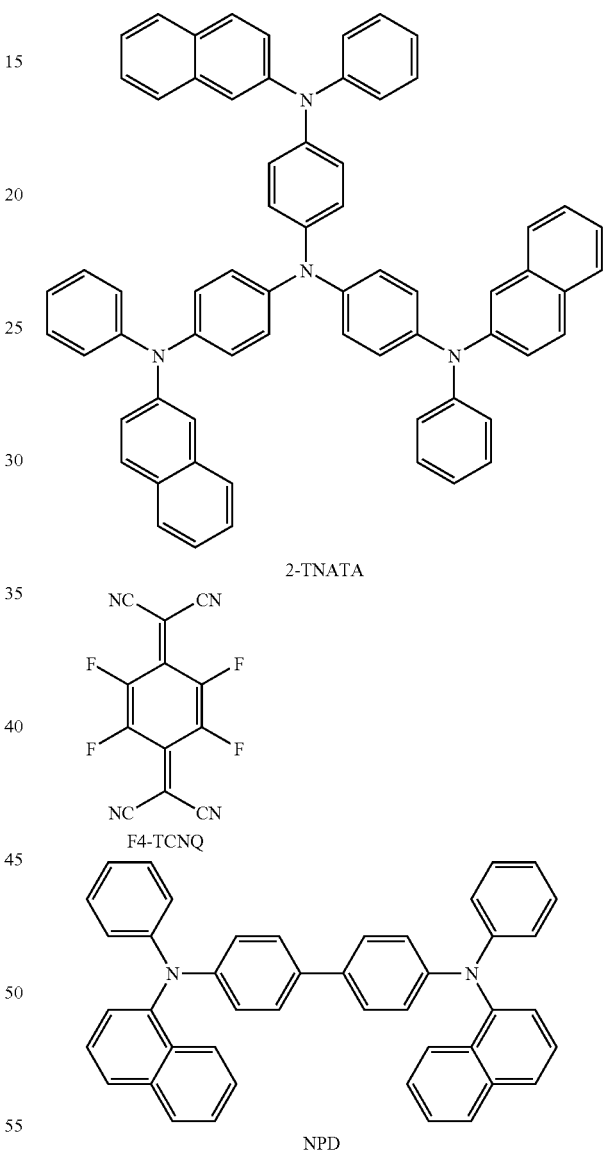

2-TNATA

F4-TCNQ

NPD

After forming the hole transport layer, a light emitting layer was formed thereon. The light emitting layer was formed as a mixed layer (thickness 60 nm) by co-deposition using BAlq as a host material having electron transportability, light emitting material A as a light emitting material (red light emitting material) having hole transportability, and binder 1 as an electrically inert material (organic binder). The structural formulas of BAlq, light emitting material A and binder 1 are as follows.

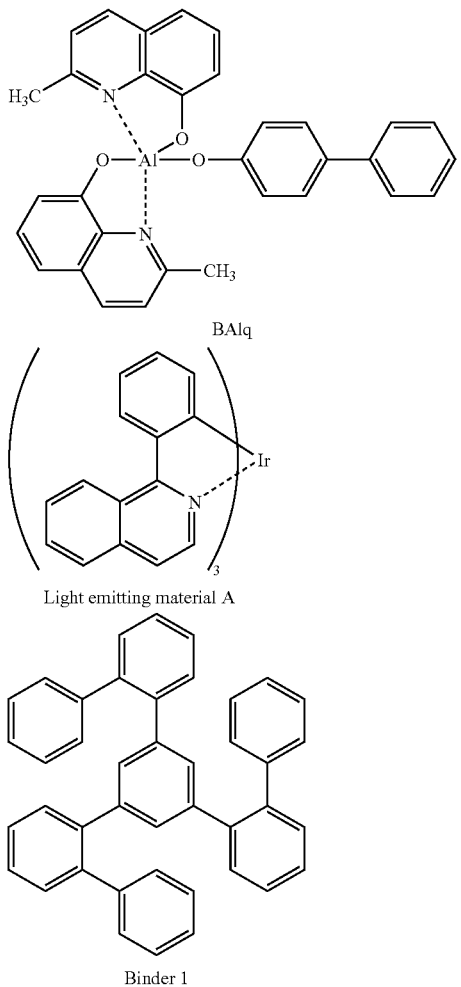

BAlq

Light emitting material A

Binder 1

Figure 4:
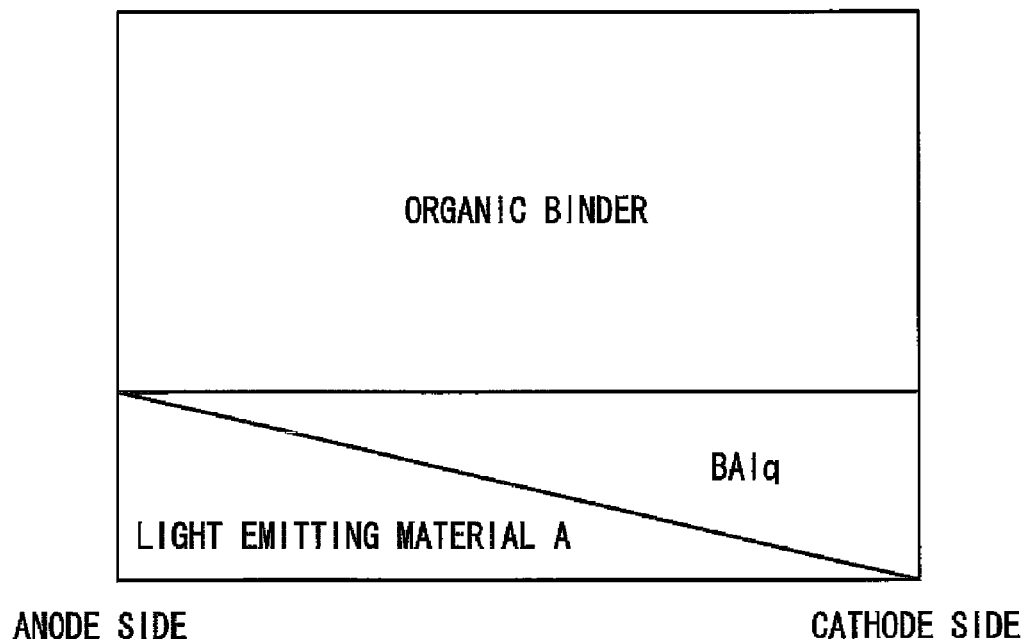
FIG. 4 is a diagram showing the concentration distribution in the light emitting layer of the organic EL device produced in Example 1.

At the time of forming the light emitting layer, the light emitting layer was formed such that the various constituent materials have concentration distributions as shown in FIG. 4, by varying the deposition rate of each of the constituent materials. Specifically, the concentration of the light emitting material A was continuously increased from 0% at the interface at the cathode side to 20% at the interface at the anode side, while the concentration of BAlq was continuously decreased from 20% at the interface at the cathode side to 0% at the interface at the anode side. The concentration of the binder 1 (organic binder) was made constant at 80% from the interface at the anode side to the interface at the cathode side. The respective concentrations of the materials in the region near the interface at the anode side were 19% for the light emitting material A, 1% for BAlq, and 80% for the binder 1, while the respective concentrations in the region near the interface at the cathode side were 1% for the light emitting material A, 19% for BAlq, and 80% for the binder 1.

After forming the light emitting layer, a film of BAlq was formed as an electron transport layer to a thickness of 40 nm.

After forming the electron transport layer, a LiF film was formed thereon to a thickness of 1 nm, and a film of Al (thickness 100 nm) was further formed as a cathode thereon.

As such, an organic EL device having an organic layer including a light emitting layer sandwiched between an ITO anode and an Al cathode was produced. The layer configuration, thickness of each layer, and the like are as follows.

ITO(100 nm)/2-TNATA+1.0% F4-TCNQ(160 nm)/
NPD(10 nm)/0%→20% BAlq+80% organic
binder+20%→0% light emitting material A(60
nm)/BAlq(40 nm)/LiF(1 nm)/Al(100 nm)

The external quantum efficiency and the luminance half-life of the obtained organic EL device (luminescent device) were measured by the following methods.

<Measurement of External Quantum Efficiency>

A direct current voltage was applied to the produced luminescent device using a source measure unit Model 2400 manufactured by Keithley Instruments, Inc., to allow the luminescent device to emit red light. The luminescence spectrum and the quantity of light were measured using a luminance meter SR-3 manufactured by Topcon Technohouse Corp., and the external quantum efficiency was calculated from the luminescence spectrum, quantity of light and the current applied during the measurement.

<Measurement of Luminance Half-Life>

The luminescent device was subjected to continuous light emission by constant current driving at an initial luminance of 300 $cd/m^2$, and the time taken for the luminance to reach 150 $cd/m^2$ (luminance half-life) was measured.

As a result of the above measurements, the external quantum efficiency at 300 $cd/m^2$ was 13.5%, and the luminance half-life was 39,000 hours.

Further, as a result of measuring the external quantum efficiency at a high luminance of 10000 $cd/m^2$, the value was found to be 12.4%. This implies that 92% of the external quantum efficiency at 300 $cd/m^2$ was maintained, and thus the decrease in efficiency under a high luminance condition was small.

Comparative Example 1

Figure 5:
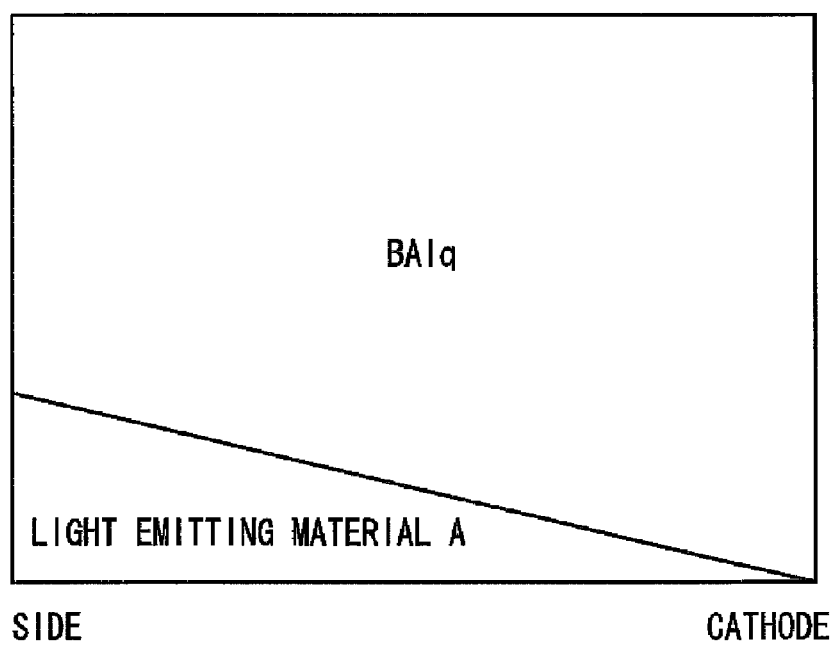
FIG. 5 is a diagram showing the concentration distribution in the tight emitting layer of the organic EL device produced in Comparative Example 1.
Figure 6:
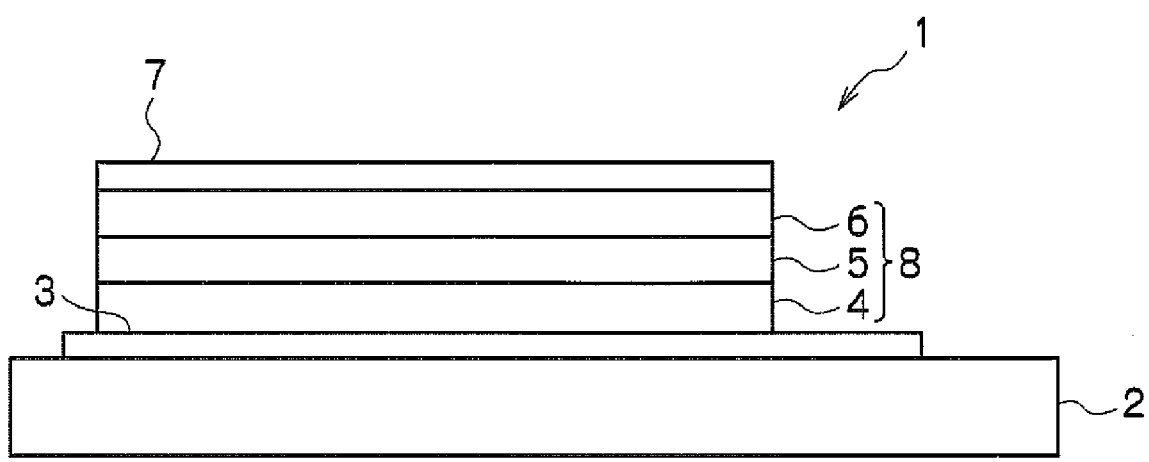
FIG. 6 is a schematic diagram showing an exemplary configuration of an organic EL device.

An organic EL device having the same layer configuration and thicknesses as in the organic EL device of Example 1, except for the light emitting layer, was produced. The light emitting layer was formed using the light emitting material A and BAlq, such that the respective materials have concentration distributions as shown in FIG. 5. The layer configuration, thickness of each of the layers, and the like of the luminescent device are as follows.

ITO(100 nm)/2-TNATA+1.0% F4-TCNQ(160 nm)/
NPD(10 nm)/80%→100% BAlq+20%→0%
Light emitting material A(60 nm)/BAlq(40 nm)/
LiF(1 nm)/Al(100 nm)

The external quantum efficiency and the luminance half-life of the obtained organic EL device were measured under the same conditions as in Example 1, and as a result, the external quantum efficiency at 300 $cd/m^2$ was 11.0%, and the luminance half-life was 21,000 hours.

Furthermore, the external quantum efficiency at a high luminance of 10000 $cd/m^2$ was measured and found to be 9.0%. This implies that 82% of the external quantum efficiency at 300 $cd/m^2$ was maintained, and thus the decrease in efficiency was larger compared to the case of Example 1.

Example 2

An organic EL device was produced in the same manner as in Example 1, except that the host material having electron transportability in the light emitting layer of Example 1 was changed from BAlq to host material A, and the light emitting material having hole transportability was changed from light emitting material A to Ir(ppy)$_3$ (green light emitting material). The structural formulas of Ir(ppy)$_3$ and host material A are as follows.

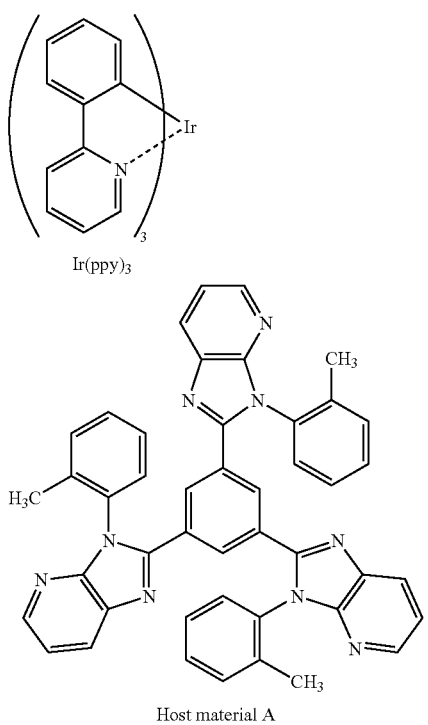

Ir(ppy)₃

Host material A

The obtained organic EL device was subjected to measurement of the external quantum efficiency under the same conditions as in Example 1, and as a result, the external quantum efficiency at 300 cd/m² was 17.0%.

Furthermore, the external quantum efficiency at a high luminance of 10000 cd/m² was measured, and it was found to be 15.8%. This implies that 93% of the external quantum efficiency at 300 cd/m² was maintained, and thus the decrease in efficiency at high luminance was small.

As discussed in the above, the present invention was described, but the present invention is not intended to be limited to the above exemplary embodiments and Examples.

Figure 7:
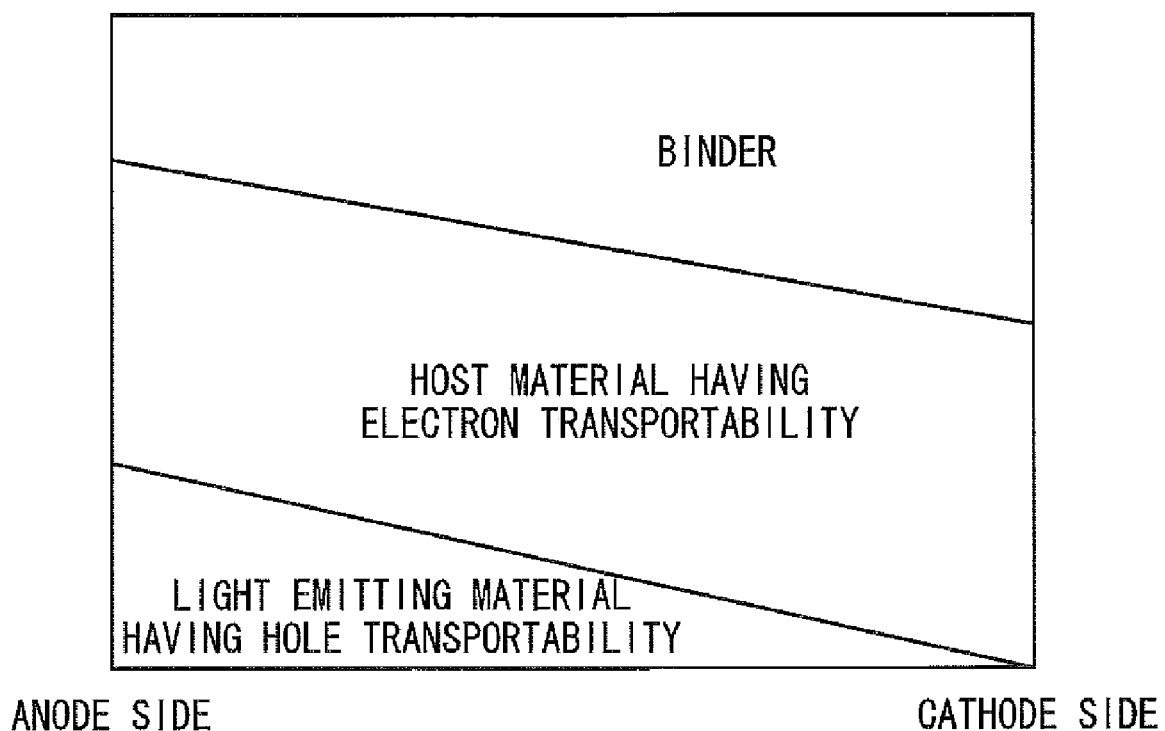
FIG. 7 is a diagram showing the concentration distribution in the light emitting layer of an organic EL device according to another embodiment of the invention.

For example, the respective concentration distributions of the constituent materials in the light emitting layer of the organic EL device according to the present invention are not limited to those shown in FIG. 2 to FIG. 4, and for example, a concentration distribution in which, as shown in FIG. 7, the concentration of the light emitting material having hole transportability is gradually increased from the cathode side toward the anode side, the concentration of the electrically inert material (binder) is gradually decreased, and the concentration of the host material having electron transportability is almost uniform or is gradually decreased, is also acceptable.

In the case of producing an emitting apparatus or display apparatus equipped with the organic EL device according to the present invention, the driving mode is not limited, and both the passive matrix mode and the active matrix mode can be employed. The color of emitted light is also not limited, and the present invention can be applied to any of monochromatic displays, area color displays and full color displays.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent device comprising:
    an anode,
    a cathode disposed facing the anode, and an organic layer that is sandwiched between the anode and the cathode and that includes at least a light emitting layer,
    wherein the light emitting layer comprises a light emitting compound that is a hole transporting compound, a host material having electron transportability and an electrically inert material, and the concentration of the light emitting compound that is a hole transporting compound gradually increases overall from a cathode side toward an anode side in the light emitting layer.

2. The organic electroluminescent device according to claim 1, wherein the concentration of the electrically inert material in the light emitting layer gradually increases from the cathode side toward the anode side.

3. The organic electroluminescent device according to claim 1, wherein the concentration of the light emitting compound that is a hole transporting compound in a region near an interface at the cathode side of the light emitting layer, is from 0% by mass to 50% by mass relative to the concentration of the light emitting compound that is a hole transporting compound in a region near an interface at the anode side of the light emitting layer.

4. The organic electroluminescent device according to claim 1, wherein the concentration of the light emitting compound that is a hole transporting compound in the light emitting layer is from 0% by mass to 10% by mass in a region near an interface at the cathode side.

5. The organic electroluminescent device according to claim 1, wherein the electrically inert material is an organic material having an energy difference Eg between the highest occupied molecular orbital and the lowest unoccupied molecular orbital of 4.0 eV or greater.

6. The organic electroluminescent device according to claim 5, wherein the organic material is a compound represented by the following formula (1):

$$L\text{-}(Ar)_m \qquad \text{Formula (1)}$$

wherein Ar represents a group represented by the following formula (2); L represents a trivalent or higher-valent benzene skeleton; and m represents an integer of 3 or more:

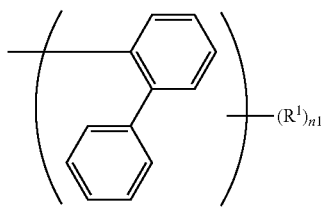

Formula (2)

wherein $R^1$ represents a substituent, and when $R^1$ is present in plurality, each $R^1$ may be identical with or different from another $R^1$; and n1 represents an integer from 0 to 9.

7. The organic electroluminescent device according to claim 5, wherein the organic material is a siloxane compound.

8. The organic electroluminescent device according to claim 1, wherein the electrically inert material is an inorganic dielectric material.

9. The organic electroluminescent device according to claim 8, wherein the inorganic dielectric material is at least one selected from the group consisting of silicon nitride, silicon oxynitride, silicon oxide and silicon carbide.

10. The organic electroluminescent device according to claim 1, wherein the light emitting compound that is a hole transporting compound is a phosphorescent light emitting material.

11. The organic electroluminescent device according to claim 1, wherein the concentration of the electrically inert material in the light emitting layer is contained in an amount of 10 to 80% by mass.

12. The organic electroluminescent device according to claim 1, wherein the concentration of the host material having electron transportability in the light emitting layer gradually increases from the anode side toward the cathode side.

13. The organic electroluminescent device according to claim 1, wherein the concentration of the light emitting compound that is a hole transporting compound gradually increases from a cathode side toward an anode side without decreasing in the light emitting layer.

* * * * *